United States Patent
Ogura

(10) Patent No.: US 9,939,494 B2
(45) Date of Patent: Apr. 10, 2018

(54) BATTERY SYSTEM AND METHOD OF DETERMINING POLARIZATION OF SECONDARY BATTERY

(75) Inventor: Takashi Ogura, Miyoshi (JP)

(73) Assignee: Toyota Jidosha Kabushiki Kaisha, Toyota-shi, Aichi (JP)

( * ) Notice: Subject to any disclaimer, the term of this patent is extended or adjusted under 35 U.S.C. 154(b) by 566 days.

(21) Appl. No.: 14/400,960

(22) PCT Filed: May 15, 2012

(86) PCT No.: PCT/JP2012/003166
§ 371 (c)(1),
(2), (4) Date: Nov. 13, 2014

(87) PCT Pub. No.: WO2013/171786
PCT Pub. Date: Nov. 21, 2013

(65) Prior Publication Data
US 2015/0134283 A1    May 14, 2015

(51) Int. Cl.
*H02J 7/00* (2006.01)
*G01R 31/36* (2006.01)
*H01M 10/48* (2006.01)

(52) U.S. Cl.
CPC ..... *G01R 31/3627* (2013.01); *G01R 31/3648* (2013.01); *H01M 10/48* (2013.01); *H01M 2220/20* (2013.01)

(58) Field of Classification Search
CPC .................................................. G01R 31/3627
USPC .................... 324/426; 180/65.29; 320/136
See application file for complete search history.

(56) References Cited

U.S. PATENT DOCUMENTS

| 8,018,203 B2* | 9/2011 | Nishi ...... | B60K 6/365 320/124 |
|---|---|---|---|
| 8,336,651 B2* | 12/2012 | Nishi ...... | B60K 6/445 180/65.29 |
| 2007/0090805 A1 | 4/2007 | Mizuno et al. | |
| 2010/0085057 A1 | 4/2010 | Nishi et al. | |

FOREIGN PATENT DOCUMENTS

| JP | 2007-121030 | 5/2007 |
| JP | 2008-243373 | 10/2008 |

* cited by examiner

*Primary Examiner* — Lam Nguyen
(74) *Attorney, Agent, or Firm* — Finnegan, Henderson, Farabow, Garrett & Dunner, LLP

(57) ABSTRACT

A concentration distribution in an active material of a battery unit is calculated by using a diffusion equation, and a first polarization elimination time taken for the concentration distribution in the active material to fall within an allowable range is calculated assuming that charge and discharge of the battery unit is not performed. A concentration distribution in an electrolyte of the battery unit is calculated by using a diffusion equation, and a second polarization elimination time taken for the concentration distribution in the electrolyte to fall within an allowable range is calculated assuming that the charge and the discharge of the battery unit is not performed. It is determined that polarization of the battery unit is eliminated when a time for which the charge and the discharge of the battery unit is not performed is longer than the longer one of the first polarization elimination time and the second polarization elimination time.

10 Claims, 12 Drawing Sheets

FIG. 3

| Symbol | Description |
|---|---|
| $c_{e,j}$ | LITHIUM CONCENTRATION IN ELECTROLYTIC SOLUTION |
| $c_{s,j}$ | LITHIUM CONCENTRATION IN ACTIVE MATERIAL |
| $c_{s,j,max}$ | MAXIMUM LITHIUM CONCENTRATION |
| $c_{se,j}$ | LITHIUM CONCENTRATION AT ACTIVE MATERIAL INTERFACE |
| $\phi_{e,j}$ | POTENTIAL OF ELECTROLYTIC SOLUTION |
| $\phi_{s,j}$ | POTENTIAL OF ACTIVE MATERIAL |
| $T$ | ABSOLUTE TEMPERATURE |
| $j_j^{Li}$ | LITHIUM PRODUCTION AMOUNT IN UNIT VOLUME AND UNIT TIME (REACTION CURRENT DENSITY) $I = \int j_j^{Li} dv$ |
| $\alpha_{aj}$ | TRANSFER COEFFICIENT IN ELECTRODE REACTION $j_j^{Li}$ (OXIDATION REACTION) |
| $\alpha_{cj}$ | TRANSFER COEFFICIENT IN ELECTRODE REACTION $j_j^{Li}$ (REDUCTION REACTION) $\alpha_{sj} + \alpha_{cj} = 1$ |
| $F$ | FARADAY'S CONSTANT |
| $i_{0j}$ | EXCHANGE CURRENT DENSITY |
| $\eta_j$ | OVERVOLTAGE IN ELECTRODE REACTION $j_j^{Li}$ |
| $U_j$ | OPEN CIRCUIT VOLTAGE (OCV) |
| $\theta_j$ | LOCAL SOC AT ACTIVE MATERIAL INTERFACE $\theta_j = \dfrac{C_{sej}}{C_{sj,max}}$ |
| $R_f$ | FILM RESISTANCE OF ELECTRODE SURFACE |
| $t_+^0$ | TRANSFERENCE NUMBER OF LITHIUM ION |
| $D_{s,j}$ | DIFFUSION COEFFICIENT OF ACTIVE MATERIAL |
| $D_{e,j}^{eff}$ | EFFECTIVE DIFFUSION COEFFICIENT OF ELECTROLYTIC SOLUTION |
| $a_{s,j}$ | SURFACE AREA OF ACTIVE MATERIAL PER UNIT VOLUME OF ELECTRODE |
| $r_{s,j}$ | RADIUS OF ACTIVE MATERIAL |
| $\varepsilon_{s,j}$ | VOLUME FRACTION (ACTIVE MATERIAL) $\varepsilon_s + \varepsilon_e + \varepsilon_p + \varepsilon_f = 1$ |
| $\varepsilon_{e,j}$ | VOLUME FRACTION (ELECTROLYTIC SOLUTION) |
| $\kappa_j^{eff}$ | EFFECTIVE ION CONDUCTIVITY OF ELECTROLYTIC SOLUTION |
| $\kappa_{Dj}^{eff}$ | DIFFUSION CONDUCTIVITY OF ELECTROLYTIC SOLUTION |
| $\sigma_j^{eff}$ | EFFECTIVE CONDUCTIVITY OF ACTIVE MATERIAL |
| $I$ | CURRENT DENSITY (PER UNIT SURFACE AREA OF ELECTRODE PLATE) |
| $L_j$ | THICKNESS OF ELECTRODE |

FIG. 12

| POLARIZATION ELIMINATION TIME (T1) | | BATTERY TEMPERATURE | | |
|---|---|---|---|---|
| | | LOWER | ·······▶ | HIGHER |
| LITHIUM CONCENTRATION DIFFERENCE (MAXIMUM VALUE) | LARGER | LONGEST | ◀······(LONGER) | ▲ |
| | | ▲ | (LONGER) | (LONGER) |
| | ↓ | | | |
| | SMALLER | ◀ | (LONGER) | SHORTEST |

FIG. 13

| POLARIZATION ELIMINATION TIME (T2) | | BATTERY TEMPERATURE | | |
|---|---|---|---|---|
| | | LOWER | ·······▶ | HIGHER |
| LITHIUM CONCENTRATION DISTRIBUTION $\Delta c_e$ | LARGER | LONGEST | ◀······(LONGER) | ▲ |
| | | ▲ | (LONGER) | (LONGER) |
| | ↓ | | | |
| | SMALLER | ◀ | (LONGER) | SHORTEST |

BATTERY SYSTEM AND METHOD OF DETERMINING POLARIZATION OF SECONDARY BATTERY

CROSS REFERENCE TO RELATED PATENT APPLICATIONS

This application is a national phase of International Application No. PCT/JP2012/003166, filed on May 15, 2012, which is incorporated herein in its entirety by reference.

TECHNICAL FIELD

The present invention relates to a battery system and a determining method for determining whether or not polarization of a secondary battery is eliminated.

BACKGROUND ART

Patent Document 1 has described a technique in which it is determined that polarization of a battery is eliminated when a predetermined time has elapsed since switching of an ignition key to OFF. Since charge and discharge of the battery is not performed after the switching of the ignition key to OFF, the polarisation of the battery can be changed to be eliminated. When it is determined that the polarization of the battery is eliminated, the current and the voltage of the battery are sampled, and the SOC (State Of Charge) of the battery is estimated, on the basis of the current and the voltage.

In the battery where the polarization occurs, the polarization may vary to reduce the accuracy in estimating the SOC. To address this, in the technique described in Patent Document 1, the SOC of the battery is estimated after the elimination of the polarization of the battery is determined, thereby improving the accuracy in estimating the SOC.

PRIOR ART DOCUMENTS

Patent Documents

[Patent Document 1] Japanese Patent Laid-Open No. 2007-121030 (FIG. 10)
[Patent Document 2] Japanese Patent Laid-Open No. 2008-243373

DISCLOSURE OF THE INVENTION

Problems to be Solved by the Invention

The technique described in Patent Document 1 sets a necessary and sufficient time for the elimination of the polarization as the predetermined time used to determine whether or not the polarisation of the battery is eliminated. In other words, the predetermined time is set at a fixed value.

When the fixed value is used as the predetermined time, the determination of whether or not the polarization is eliminated may be erroneously made. Specifically, since the polarization of the battery varies depending on a history of charge and discharge of the battery, the polarization may be eliminated even before the elapse of the predetermined time (fixed value), or the polarization may not be eliminated even after the elapse of the predetermined time (fixed value).

The polarization of the battery typically includes polarization in an active material, and polarization in an electrolytic solution. Patent Document 1, however, does not take them into account.

Means for Solving the Problems

According to a first aspect, the present invention provides a battery system including a chargeable and dischargeable battery unit, and a controller estimating a polarization state of the battery unit. The controller calculates a concentration distribution in an active material of the battery unit by using a diffusion equation, and calculates a first polarization elimination time taken for the concentration distribution in the active material to fall within an allowable range assuming chat the charge and the discharge of the battery unit is not performed.

The controller also calculates a concentration distribution in an electrolyte of the battery unit by using a diffusion equation, and calculates a second polarization elimination time taken for the concentration distribution in the electrolyte to fall within an allowable range assuming that the charge and the discharge of the battery unit is not performed. The controller determines that polarization of the battery unit is eliminated when a time for which the charge and the discharge of the battery unit is not performed is longer than a longer one of the first polarization elimination time and the second polarization elimination time.

In the first aspect of the present invention, the diffusion equation (a battery model expression, later described) is used to calculate the concentration distribution in the active material and the concentration distribution in the electrolyte, so that the concentration distribution in the present battery unit can be obtained. Once the present concentration distribution is obtained, the diffusion equation can be used to calculate the time for the concentration distribution to fall within the allowable range (polarization elimination time). This calculation can provide the polarization elimination time by taking account of the present state of the battery unit (concentration distribution) to appropriately estimate the time oaken to eliminate the polarization.

The polarization of the battery unit includes polarization due to the concentration distribution in the active material and polarization due to the concentration distribution in the electrolyte. In the present invention, the concentration distributions in the active material and the electrolyte are considered to set the longer one of the first polarization elimination time and the second polarization elimination time as the time taken to eliminate the polarization of the battery unit. When the time for which the charge and discharge of the battery unit is not performed is longer than that polarization elimination time of the battery unit, it can be determined that the polarization is eliminated in both the active material and the electrolyte. This can prevent at least one of the polarizations in the active material and the electrolyte from being maintained in the battery unit.

When the time for which the charge and the discharge of the battery unit is not performed is longer than the longer one of the first and second polarization elimination times, the voltage of the battery unit can be obtained by using a voltage sensor. The voltage obtained when the polarization of the battery unit is eliminated can be regarded as the open circuit voltage of the battery unit. By using information representing the relationship between the state of charge (SOC) and the open circuit voltage of the battery unit, the state of charge associated with the obtained voltage (open circuit voltage) can be specified.

In the present invention, the voltage of the battery unit in which the polarisation is eliminated can be obtained to provide the open circuit voltage of the battery unit accurately. Since a voltage change amount resulting from the polarization can be removed, the open circuit voltage of the battery unit can be obtained easily. Once the open circuit voltage can be accurately obtained, the state of charge can be accurately estimated on the basis of the open circuit voltage. If the open circuit voltage is not accurately obtained, the state of charge cannot be accurately obtained in specifying the state of charge associated with the open circuit voltage.

When the time for which the charge and the discharge of the battery unit is not performed is shorter than the longer one of the first and second polarization elimination times, it is determined that the polarization of the battery unit is not eliminated. In this case, a voltage drop characteristic of the battery unit observed while the charge and the discharge of the battery unit is not performed, can be used to calculate the open circuit voltage of the battery unit. This allows the open circuit voltage of the battery unit to be specified even when the polarization occurs in the battery unit. Then, the state of charge of the battery unit can be estimated on the basis of the calculated open circuit voltage.

The first polarization elimination time can be specified on the basis of a maximum concentration at which the largest difference is present between an average concentration calculated from the concentration distribution in the active material and a concentration in the active material. Specifically, the relationship between the maximum concentration and the first polarization, elimination time can be determined previously and used to specify the first polarization elimination time associated with the maximum concentration.

The second polarization elimination time can be specified on the basis of the concentration distribution in the electrolyte. Specifically, the relationship between the concentration distribution in the electrolyte and the second polarization elimination time can be determined previously and used to specify the second polarization elimination time associated with the concentration distribution in the electrolyte.

For calculating the concentration distribution in the active material, a concentration at each of the center and an interface of the active material can be set as a boundary condition. With this setting, the diffusion equation can be used to calculate the concentration, distribution in the active material.

The battery unit can be formed of a unit cell or can be formed of a plurality of unit cells connected electrically. The battery unit can be mounted on a vehicle, and an electric energy output from the battery unit can be converted, into a kinetic energy for running the vehicle.

According to a second aspect, the present invention provides a determination method for determining a polarisation state of a chargeable and dischargeable battery unit. A concentration distribution in an active material of the battery unit is calculated, by using a diffusion equation, and a first polarisation elimination time taken for the concentration distribution in the active material to fail within an allowable range is calculated assuming that the charge and the discharge of the battery unit is not performed. A concentration distribution in an electrolyte of the battery unit is calculated by using a diffusion equation, and a second polarization elimination time taken for the concentration distribution in the electrolyte to fail within an allowable range is calculated assuming that the charge and the discharge of the battery unit is not performed.

It is determined that polarization of the battery unit is eliminated, when a time for which the charge and the discharge of the battery unit is not performed is longer than a longer one of the first polarization elimination time and the second polarization elimination time. The second aspect of the present invention can achieve the same advantages as those in the first aspect.

BRIEF DESCRIPTION OF THE DRAWINGS

FIG. 3 is a table showing a list of variables and the like used in a battery model expression.

FIG. 12 is a table showing a relationship between a polarization elimination time, a battery temperature and a lithium concentrate difference.

FIG. 13 is a table showing a relationship between a polarization elimination time, a battery temperature and a lithium concentration distribution.

MODE FOR CARRYING OUT THE INVENTION

An embodiment of the present invention will hereinafter be described.

Embodiment 1

Figure 1:
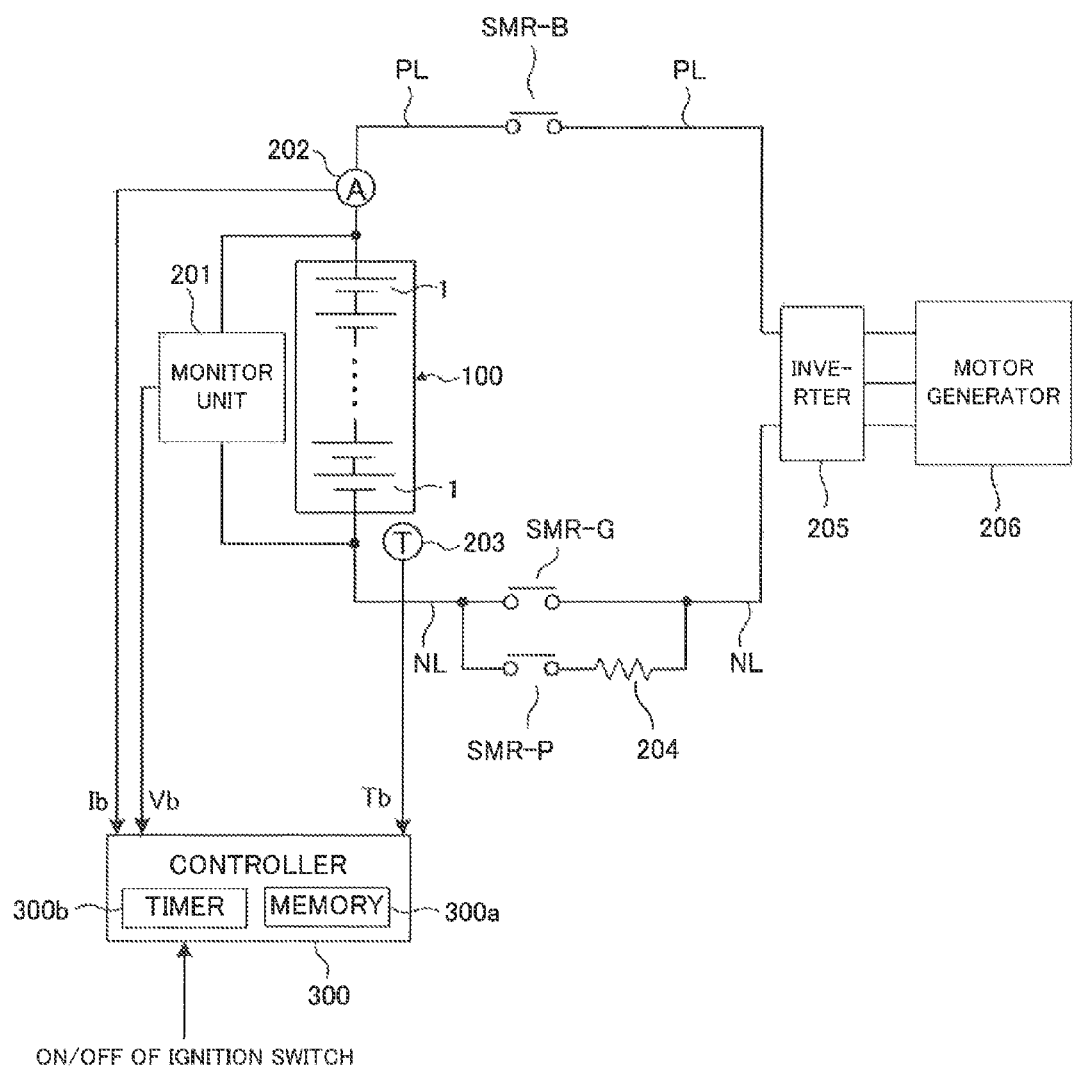
FIG. 1 is a diagram showing the configuration of a battery system.

FIG. 1 is a diagram showing the configuration of the battery system in the present embodiment. The battery system shown in FIG. 1 can be mounted on a vehicle. Examples of the vehicle include an HV (Hybrid Vehicle), a PHV (Plug-in Hybrid Vehicle), and an EV (Electric Vehicle).

The HV includes, as a power source for running of the vehicle, another power source such as an internal combustion and a fuel cell in addition to an assembled battery pack described later. The PHV allows charge of the assembled battery by using electric power from an external power source in the HV. The EV includes only the assembled battery as the power source of the vehicle and allows charge of the assembled battery by receiving electric power from the external power source. The external power source is a power source (for example, commercial power source) that is provided separately from the vehicle outside the vehicle.

The assembled battery 100 has a plurality of secondary batteries (corresponding to a battery unit) 1 electrically connected in series. Example of the secondary battery 1 serving as unit cell is a nickel metal, hydride battery, a lithium-ion battery or the like. The number of the secondary batteries 1 can be set as appropriate based on the required output of the assembled battery 100 or the like.

Although all the secondary batteries 1 are connected, electrically in series in the assembled battery 100 of the present embodiment, the present invention is not limited thereto. The assembled battery 100 may include a plurality of secondary batteries 1 connected electrically in parallel. A monitor unit. 201 detects a voltage between terminals of the assembled battery 100 or detects a voltage Vb of each secondary battery 1 and outputs the detection result to a controller 300.

When the plurality of secondary batteries 1 constituting the assembled battery 100 are divided into a plurality of battery blocks (corresponding to battery units), the monitor unit 201 can also detect the voltage of each of the battery blocks. The battery block is formed of a plurality of secondary batteries 1 connected electrically in series, and the plurality of battery blocks are connected electrically in series to constitute the assembled battery 100.

A current sensor 202 detects a current Ib flowing through the assembled battery 100 and outputs the detection result to the controller 300. The discharge current Ib is set to a positive value (Ib>0) and the charge current Ib is set to a negative value (Ib<0). A temperature sensor 203 detects a temperature Tb of the assembled battery 100 (the secondary battery 1) and outputs the detection result to the controller 300. The temperature Tb of the secondary batteries 1 arranged different positions can be detected by using a plurality of temperature sensors 203.

The controller 300 has a memory 300*a*. The memory 300*a* stores various types of information for allowing the controller 300 to perform predetermined processing (for example, processing described in the present embodiment). The controller 300 also has a timer 300*b*. The timer 300*b* is used to measure a time (duration) for which an ignition switch is OFF, in other words, a time (duration) for which the assembled battery 100 is not charged and discharged, as later described. Although the memory 300*a* and the timer 300*b* are contained in the controller 300, the memory 300*a* and the timer 300*b* may be provided outside the controller 300.

A system main relay SMR-B is provided on a positive electrode line (cable) PL connected to a positive electrode terminal of the assembled battery 100. The system main relay SMR-B is switched between ON and OFF in response to a control signal from the controller 300. A system main relay SMR-G is provided on a negative electrode line (cable) NL connected to a negative electrode terminal of the assembled battery 100. The system main relay SMR-G is switched between ON and OFF in response to a control signal from the controller 300.

A system main, relay SMR-P and a current limiting resistor 204 are electrically connected in parallel with the system, ma in relay SMR-G. The system main relay SMR-P and the current limiting resistor 204 are electrically connected in series. The system main relay SMR-P is switched between ON and OFF in response to a control signal from the controller 300. The current limiting resistor 204 is used for suppressing a flow of inrush current when the assembled battery 100 is connected to a load (specifically, an inverter 205).

For connecting the assembled battery 100 to the inverter 205, the controller 300 first switches the system main relay SMR-B from OFF to ON and switches the system main relay SMR-P from OFF to ON. This causes an electric current to pass through the current limiting resistor 204.

Next, the controller 300 switches the system main relay SMR-G from OFF to ON and then switches the system main relay SMR-P from ON to OFF. This completes the connection between the assembled battery 100 and the inverter 205 and the battery system shown in FIG. 1 is in stamp status (Ready-On). The controller 300 receives information about an ignition switch of the vehicle, and the controller 300 starts the battery system in response to switching of the ignition switch from OFF to ON.

On the other hand, when the ignition switch is switched from ON to OFF, the controller 300 switches the system, main relays SMR-B and SMR-G from ON to OFF. This breaks the connection between the assembled battery 100 and the inverter 205 and the battery system is in a stopped state (Ready-Off).

The inverter 205 converts a DC power from the assembled battery 100 into an AC power and outputs the AC power to a motor generator 206. A three-phase AC motor can be used as the motor generator 206, for example. The motor generator 206 receives the AC power from the inverter 205 to generate a kinetic energy for running of the vehicle. The kinetic energy generated by the motor generator 206 is transferred to wheels and then the vehicle can be run.

For decelerating or stopping the vehicle, the motor generator 206 converts a kinetic energy produced in braking of the vehicle into an electric energy (AC power). The inverter 205 converts the AC power generated by the motor generator 206 into a DC power and outputs the DC power to the assembled battery 100. This allows the assembled battery 100 to accumulate the regenerative power.

Although the assembled battery 100 is connected, to the inverter 205 in the present embodiment, the present invention is not limited thereto. Specifically, a step-up circuit may be provided, on the current path between the assembled battery 100 and the inverter 205. The step-up circuit can increase the voltage output from the assembled, battery 100 and output the electric power at the increased voltage to the inverter 205. In addition, the step-up circuit can reduce the voltage output from the inverter 205 and output the electric power at the reduced voltage to the assembled battery 100.

Figure 2:
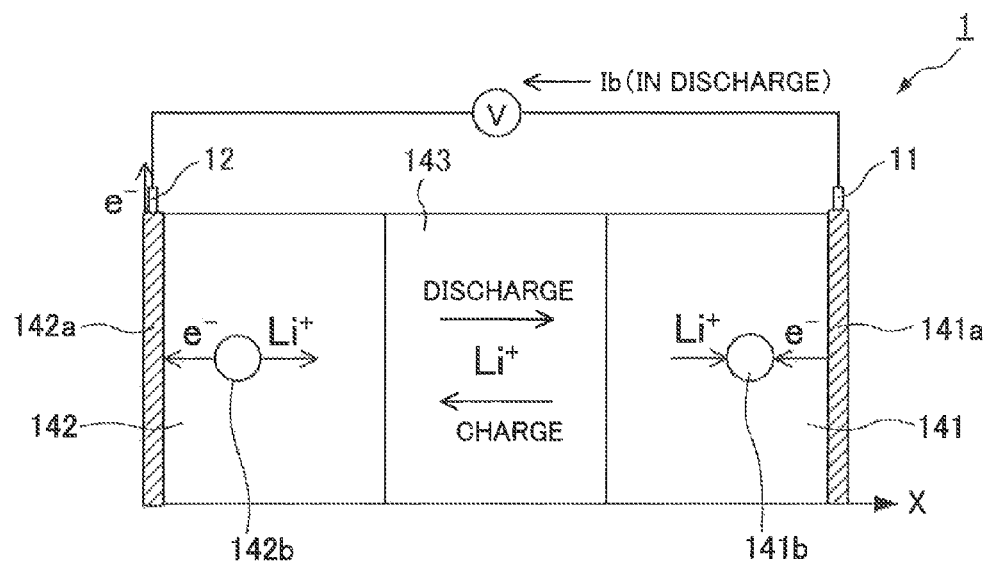
FIG. 2 is a schematic diagram showing the configuration of a secondary battery.

Next, a battery model used in the present embodiment is now described. FIG. 2 is a schematic diagram showing the configuration of a secondary battery 1. The lithium-ion secondary battery is used as the secondary battery 1, for example. An coordinate axis x shown in FIG. 2 shows positions in a thickness direction of the electrode.

A secondary battery 1 has a positive electrode 141, a negative electrode 142 and a separator 143. The separator 143 is located between the positive electrode 141 and the negative electrode 142 and contains an electrolytic solution. A solid electrolyte can be used instead of the electrolytic solution. A layer of the solid electrolyte can be arranged between the positive electrode 141 and the negative electrode 142.

The positive electrode 141 has a collector plate 141*a* made of aluminum or the like. The collector plate 141*a* is electrically connected to a positive electrode terminal 11 of the secondary battery 1. The negative electrode 142 has a collector plate 142*a* made of copper or the like. The collector plate 142*a* is electrically connected to a negative electrode terminal 12 of the secondary battery 1.

Each of the negative electrode 142 and the positive electrode 141 is formed of a group of spherical active materials 142*b* and 141*b*. When the secondary battery 1 is discharged, a chemical reaction occurs at the interface of the active material 142b in the negative electrode 142 to release a lithium ion Li+ and an electron e−. In addition, a chemical reaction occurs at the interface of the active material 141b in the positive electrode 141 to absorb a lithium ion Li+ and an electron e−. The lithium ions Li+ are passed between the negative electrode 142 and the positive electrode 141 to perform charge or discharge of the secondary battery 1 to produce a discharge current Ib (Ib<0) or a charge current Ib (Ib>0).

A basic battery model expression used in the present embodiment is represented by basic equations including the following expressions (1) to (11). FIG. 3 shows a list of variables and constants used in the battery model expression.

In the variables and constants in the model expression described below, a subscript e means a value in the electrolytic solution and a subscript s means a value in the active material. A subscript j makes a distinction between the positive electrode and the negative electrode, wherein j equal to 1 means a value in the positive electrode and j equal to 2 means a value in the negative electrode. When the variables or the constants in the positive electrode and the negative electrode are collectively represented, the subscript j is omitted. The denotation of (t) representing a function of time, the denotation of (T) representing battery temperature dependence, the denotation of (θ) representing local SOCθ dependence and the like may be omitted in the present specification. A symbol # attached to the variables or the constants represents an average value.

$$\frac{j_j^{Li}(x, \theta_j, t)}{a_{sj}} = i_{0j}(x, \theta_j, T, t) \cdot \left[\exp\left(\frac{\alpha_{aj} F}{RT} \cdot \eta_j \#(x, \theta_j, t)\right) - \exp\left(-\frac{\alpha_{cj} F}{RT} \cdot \eta_j \#(x, \theta_j, t)\right)\right] \quad (1)$$

$$\eta_j(x, \theta_j, t) = \phi_{sj}(x, t) - \phi_{ej}(x, t) - U_j(x, \theta_j, t) \quad (2)$$

The above expressions (1) and (2) represent an electrochemical reaction in the electrode (active material) and are called the Butler-Volmer equation.

An expression (3) holds as an expression relating to the conservation law of lithium ion concentration within the electrolytic solution. A diffusion equation in following expression (4) and boundary condition expressions shown in expressions (5) and (6) are used as expressions relating to the conservation law of lithium ion concentration within the active material. The expression (5) represents a boundary condition at the center of the active material. The expression (6) represents a boundary condition at the interface between the active material and the electrolytic solution (hereinafter also referred to simply as an interface).

The local SOCθ_j corresponding to local lithium, ion concentration distribution at the active material interface is defined by an expression (7). In the expression (7), $c_{sei}$ represents the lithium concentration at the active material interface in the positive electrode and the negative electrode as shown in an expression (8), and $c_{sj,max}$ represents the maximum lithium concentration within the active material.

$$\frac{\delta[\varepsilon_{ej} \cdot c_{ej}(x, t)]}{\delta t} = \nabla \cdot \left[D_{ej}^{eff} \nabla c_{ej}(x, t)\right] + \frac{1 - t_+^0}{F} \cdot j_j^{Li}(x, \theta_l, t) - \frac{i_{ej} \cdot \nabla t_+^0}{F} \quad (3)$$

$$\frac{\partial c_{sj}(x, r_j, t)}{\partial t} = D_{sj}\left[\frac{\partial^2 c_{sj}}{\partial r_j^2} + \frac{2}{r_j}\frac{\partial c_{sj}}{\partial r_j}\right] \quad (4)$$

$$\left.\frac{\partial c_{sj}(x, r_j, t)}{\partial r}\right|_{r_j=0} = 0 \quad (5)$$

$$\left.\frac{\partial[\varepsilon_{sj} \cdot c_{sj}(x, r_j, t)]}{\partial t}\right|_{r_j=r_{sj}} = -\frac{j_j^{Li}(x, \theta_j, t)}{\alpha_{sj} F} \quad (6)$$

$$\theta_j = \frac{c_{sej}}{c_{sj,max}} \quad (7)$$

$$c_{sej} = c_{sj}(x, r_{sj}, t) \quad (8)$$

An expression (9) holds as an expression relating to the conservation law of charge within the electrolytic solution, and an expression (10) holds as an expression relating to the conservation law of charge within the active material. An expression (11) representing a relationship between a current density I(t) and a reaction current density $J_j^{Li}$ holds as an electrochemical reaction expression at the active material interface.

$$\nabla \cdot [\kappa_j^{eff}(x,t) \nabla \varphi_{ej}(x,t)] + \nabla \cdot [\kappa_{Dj}^{eff}(x,t) \nabla \ln c_{ej}(x,t)] + j_j^{Li}(x, \theta_j, t) = 0 \quad (9)$$

$$\nabla \cdot [\sigma_j^{eff}(x,t) \nabla \varphi_{sj}(x,t)] - j_j^{Li}(x, \theta_j, t) = 0 \quad (10)$$

$$I(t) = \int_0^{Lj} j_2^{Li}(x, \theta_2, t) = -\int_0^{Lj}(x, \theta_1, t) \quad (11)$$

The battery model expression represented by the basic equations including the expressions (1) to (11) can be simplified as described below. The simplification of the battery model expression can reduce computing load or shorten a computing time.

It is assumed that a uniform electrochemical reaction is seen in each of the negative electrode 142 and the positive electrode 141. Specifically, it is assumed that the reaction in the x direction uniformly occurs in each of the electrodes 142 and 141. In addition, since it is assumed that uniform reactions occur in the plurality of active materials 142b and 141b included in each of the electrodes 142 and 141, the active materials 142b and 141b in each of the electrodes 142 and 141 are handled as a single active material model. Thus, the structure of the secondary battery 1 shown in FIG. 2 can be modeled as a structure shown in FIG. 4.

Figure 4:
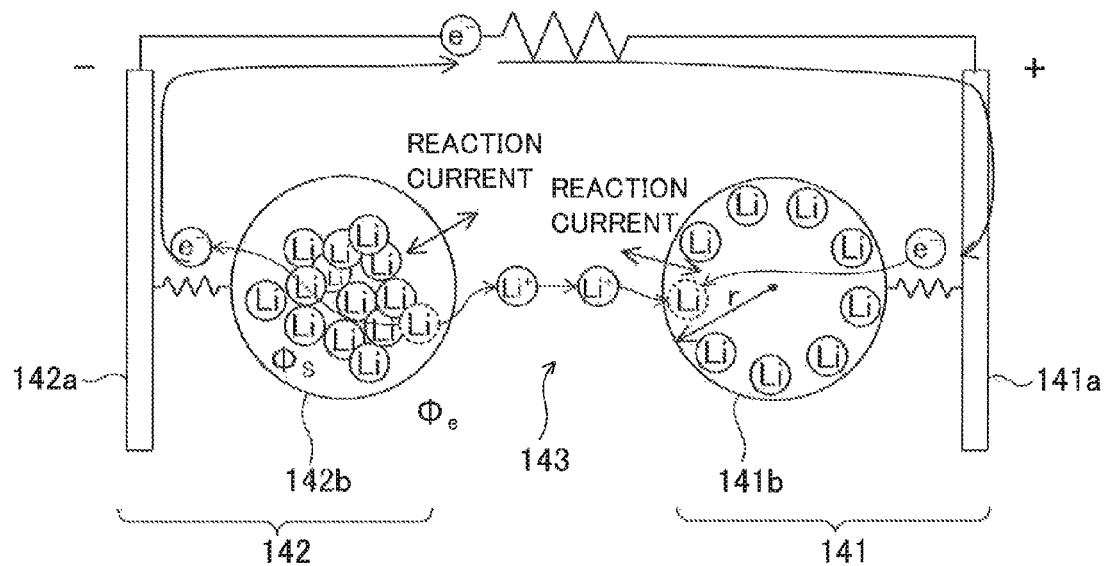
FIG. 4 is a conceptual diagram for describing the battery model.

In a battery model shown in FIG. 4, it is possible to model an electrode reaction on the surfaces of an active material model 141b (j=1) and an active material model 142b (j=2). In the battery model shown in FIG. 4, it is possible to model diffusion of lithium within the active material models 141b and 142b (diameter direction) and diffusion of lithium ions within the electrolytic solution (concentration distribution). In addition, potential distribution and temperature distribution can be modeled in each location of the battery model shown in FIG. 4.

Figure 5:
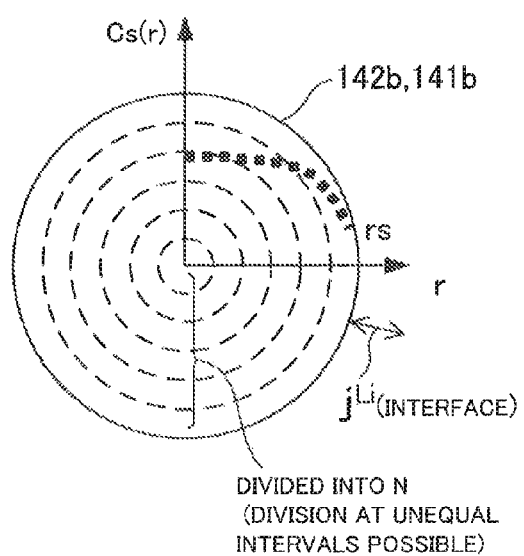
FIG. 5 is a conceptual diagram showing an active material model shown with polar coordinates.

As shown in FIG. 5, a lithium concentration $c_s$ within, each of the active material models 141b and 142b can be represented as a function on a coordinate r in a radius direction, of the active material models 141b and 142b (r represents a distance from the center of the active material to each point, $r_s$ represents the radius of the active material). It is assumed that position dependence in a circumferential direction of the active material models 141b and 142b is absent. The active material models 141b and 142b shown in FIG. 5 are used to estimate a lithium diffusion phenomenon within the active material in association with the electrochemical reaction at the interface. Each of the active material models 141b and 142b is divided into N (N is a natural number larger than 2) in the diameter direction, and for each of the N areas (k=1 to N), a lithium, concentration $c_{s,k}(t)$ is estimated in accordance with a diffusion equation, later described.

According to the battery model shown in FIG. 4, the basic equations (1) to (6) and (6) can be represented as the following expressions (1') to (6'), and (8').

$$\frac{j_j^{Li}\#(\theta_j, t)}{a_{sj}} = i_{0j}\#(\theta_j, T, t) \cdot \left[\exp\left(\frac{\alpha_{aj} F}{RT} \cdot \eta_j\#(\theta_j, t)\right) - \exp\left(-\frac{\alpha_{aj} F}{RT} \cdot \eta_j\#(\theta_j, t)\right)\right] \quad (1')$$

$$\eta_j\#(\theta_j, t) = \phi_{sj}\#(t) - \phi_{ej}\#(t) - U_j\#(\theta_j, t) \quad (2')$$

$$c_{ej}(t) = const. \quad (3')$$

$$\frac{\partial c_{sj}(r_j, t)}{\partial t} = D_{sj}\left[\frac{\partial^2 c_{sj}}{\partial r_j^2} + \frac{2}{r_j}\frac{\partial c_{sj}}{\partial r_j}\right] \quad (4')$$

$$\left.\frac{\partial c_{sj}(r_j, t)}{\partial r}\right|_{r_j=0} = 0 \quad (5')$$

$$\left.\frac{\partial [\varepsilon_{sj}, c_{sj}(r_j, t)]}{\partial t}\right|_{r_j=r_{sj}} = -\frac{j_j^{Li}\#(\theta_j, t)}{a_{sj} F} \quad (6')$$

$$c_{sej} = c_{sj}(r_{sj}, t) \quad (8')$$

In the expression (3'), it is assumed that $c_{ej}(t)$ takes a constant value by assuming that the electrolytic solution has a concentration constant over time. For the active material models 141b and 142b, the diffusion equations (4) to (6) are transformed into the diffusion equations (4') to (6') in view of only the distribution in the polar coordinate distribution. In the expression (8'), the lithium concentration $c_{sej}$ at the active material interface corresponds to the lithium concentration $c_{si}(t)$ in the outermost area of the N divided areas shown in FIG. 5.

The expression (9) relating to the conservation law of charge within the electrolytic solution is simplified into the following expression (12) by using the expression (3'). Thus, a potential $\varphi_{ej}$ of the electrolytic solution is approximated as a quadric function of x. An average potential $\varphi_{ej}\#$ within the electrolytic solution used for calculation of an overvoltage $\eta_j\#$ is determined from the following expression (13) provided by integrating the following expression (12) with an electrode thickness $L_j$.

For the negative electrode 142, the following expression (14) holds on the basis of the following expression (12). Thus, a difference (a potential difference) between an electrolytic solution average potential $\varphi_{e2}\#$ and an electrolytic solution potential at the boundary between the negative electrode 142 and the separator 143 is represented by the following expression (15). For the positive electrode 141, a difference (a potential difference) between an electrolytic solution average potential $\varphi_{e1}\#$ and an electrolytic solution potential at the boundary between the positive electrode 141 and the separator 143 is represented by the following expression (16).

$$\nabla \cdot \left[\kappa_j^{eff}(t)\nabla \phi_{ef}(x, t)\right] + j_j^{Li}\#(\theta_j, t) = 0 \Leftrightarrow \phi_{ej}(x, t) = -\frac{j_j^{Li}\#(\theta_j, t)}{2\kappa_j^{eff}} x^2 \quad (12)$$

$$\phi_{ej}\#(t) = -\frac{j_j^{Li}\#(\theta_j, t)}{2\kappa_j^{eff}} \frac{1}{L_j} \int_0^{L_j} x^2 dx = -\frac{j_j^{Li}\#(\theta_j, t)}{6\kappa_j^{eff}} \cdot L_j^2 \quad (13)$$

$$\phi_{e2}(L_2, t) = -\frac{j_2^{Li}\#(\theta_2, t)}{2\kappa_2^{eff}} L_2^2 \quad (14)$$

$$\phi_{e2}\#(t) - \phi_{e2}(L_2, t) = -\frac{j_2^{Li}\#(\theta_j, t)}{6\kappa_2^{eff}} L_2^2 - \left(-\frac{j_2^{Li}\#(\theta_2, t)}{2\kappa_2^{eff}} L_2^2\right) \quad (15)$$

$$= \frac{j_2^{Li}\#(\theta_j, t)}{3\kappa_2^{eff}} L_2^2 = \frac{L_2}{3\kappa_2^{eff}} I$$

$$\phi_{e1}\#(t) - \phi_{e1}(L_1, t) = \frac{j_1^{Li}\#(\theta_1, t)}{3\kappa_1^{eff}} L_1^2 = -\frac{L_1}{3\kappa_1^{eff}} I \quad (16)$$

The expression (10) relating to the conservation law of charge within the active material can be simplified into the following expression (17). Thus, a potential. $\varphi_{sj}$ of the active material is also approximated as a quadratic function of x. An average potential $\varphi_{sj}\#$ within the active material used for calculation of an overvoltage $\eta_j\#$ is determined from the following expression (18) provided by integrating the following expression (17) with the electrode thickness $L_j$. For the positive electrode 141, a difference (a potential difference) between an active material average potential $\varphi_{s1}\#$ and an active material potential at the boundary between the active material 141b and the collector plate 141a is represented by the following expression (19). Similarly, for the negative electrode 142, the following expression (20) holds.

$$\nabla \cdot \left[\sigma_j^{eff} \nabla \phi_{sj}(x, t)\right] - j_j^{Li}\#(\theta_j, t) = 0 \Leftrightarrow \phi_{sj}(x, t) = \frac{j_j^{Li}\#(\theta_j, t)}{2\sigma_j^{eff}} x^2 \quad (17)$$

$$\phi_{sj}\#(t) = \frac{j_j^{Li}\#(\theta_j, t)}{2\sigma_j^{eff}} \frac{1}{L_j} \int_0^{L_j} x^2 dx \quad (18)$$

$$\phi_{s1}\#(t) - \phi_{s1}(L_1, t) = -\frac{j_1^{Li}\#(\theta_1, t)}{3\sigma_1^{eff}} L_1^2 = \frac{L_1}{3\sigma_1^{eff}} I \quad (19)$$

$$\phi_{s2}\#(t) - \phi_{s2}(L_2, t) = -\frac{j_2^{Li}\#(\theta_2, t)}{3\sigma_2^{eff}} L_2^2 = \frac{L_2}{3\sigma_2^{eff}} I \quad (20)$$

Figure 6:
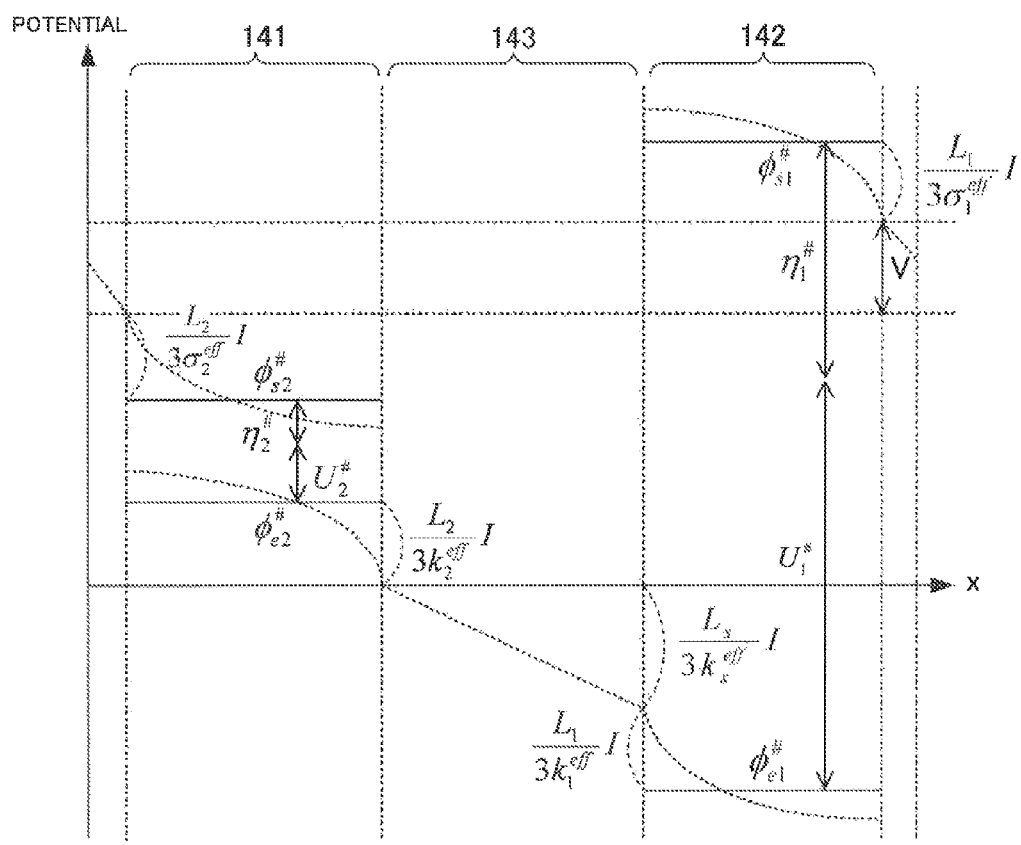
FIG. 6 is a graph showing a relationship between a terminal voltage of the secondary battery and various average potentials.

FIG. 6 shows a relationship between a terminal voltage V(t) of the secondary battery 1 and each average potential determined as described above. In FIG. 6, since the reaction current density $j_j^{Li}$ is zero in the separator 143, a voltage drop in the separator 143 is proportional to the current density I(t) and is represented as $L_s/K_s^{eff} I(t)$.

Since the electrochemical reaction in each electrode is assumed to be uniform, the following expression (21) holds between the current density I(t) per unit area of the electrode plate and the reaction current density (lithium production amount) $j_j^{Li}$.

$$I(t) = -j_1^{Li}(\theta_1, t)L_1 = j_2^{Li}(\theta_2, t)L_2 \quad (21)$$

The following expression (22) holds for a battery voltage V(t) based on the potential relationship shown in FIG. 6 and the expression (21). The following expression (22) is premised on a potential relationship expression of a following expression (23) shown in FIG. 6.

Next, an average overvoltage $\eta\#(t)$ is calculated. When $j_j^{Li}$ is set to be constant, and $\alpha_{sj}$ and $\alpha_{ej}$ are set to 0.5 with the same charge and discharge efficiency in the Butler-Volmer equation, then the following expression (24) holds.

The following expression (24) is inversely transformed to determine the average overvoltage η#(t) from the following expression (25).

$$V(t) = \phi_{s1}\#(t) - \frac{L_1}{3\sigma_1^{eff}} I(t) - \left(\phi_{s2}\#(t) + \frac{L_2}{3\sigma_2^{eff}} I(t)\right) \quad (22)$$

$$\phi_{sj}\#(t) = U_j\#(t) + \phi_{ej}\#(t) + \eta_j\#(t) \quad (23)$$

$$j_j^{Li}\# = a_{sj}i_{0j}(\theta_j, t) \cdot \left[\exp\left(\frac{\alpha_{aj}F}{RT} \cdot \eta_j\#(t)\right) - \exp\left(\frac{\alpha_{cj}F}{RT} \cdot \eta_j\#(t)\right)\right] \quad (24)$$

$$= 2a_{sj}i_{0j}(\theta_j, t)\sinh\left(\frac{\alpha_{aj}F}{RT} \cdot \eta_j\#(t)\right)$$

$$\eta_j\#(t) = \frac{RT}{\alpha_{aj}F}\text{arcsinh}\left(\frac{j_j^{Li}\#(\theta_j, t)}{2a_{sj}i_{0j}(\theta_j, t)}\right) \quad (25)$$

Average potentials $\varphi_{s1}$ and $\varphi_{s2}$ are determined with FIG. 6, and the determined values are substituted into the expression (22). Average overvoltages $\eta_1\#(t)$ and $\eta_2\#(t)$ determined from the expression (25) are substituted into the expression (23). As a result, a voltage-current relation model expression (M1a) in accordance with the electrochemical reaction model expression is derived on the basis of the expressions (1'), (21), and the above expression (2').

An active material diffusion model expression (M2a) for the active material models 141b and 142b is calculated from the expression (4') corresponding to the conservation law of lithium concentration (diffusion equation) and the boundary condition expressions (5') and (6').

$$V(t) = \{U_1\#(\theta_1, t) - U_2\#(\theta_2, t)\} + \frac{RT}{\alpha_{a1}F} \quad (M1a)$$

$$\left\{\text{arcsinh}\left(\frac{-I(t)}{2L_1a_{s1}i_{01}(\theta_1, T, t)}\right) - \text{arcsinh}\left(\frac{I(t)}{2L_2a_{s2}i_{02}(\theta_2, T, t)}\right)\right\} -$$

$$I(t)\left(\frac{L_1}{3\kappa_1^{eff}} + \frac{L_s}{3\kappa_s^{eff}} + \frac{L_2}{3\kappa_2^{eff}} + \frac{L_1}{3\sigma_1^{eff}} + \frac{L_2}{3\sigma_2^{eff}}\right)$$

$$Rd(T) = \left(\frac{L_1}{3\kappa_1^{eff}} + \frac{L_s}{3\kappa_s^{eff}} + \frac{L_2}{3\kappa_2^{eff}} + \frac{L_1}{3\sigma_1^{eff}} + \frac{L_2}{3\sigma_2^{eff}}\right) \quad (M2a)$$

$$\frac{\partial c_{s1}(r_1, t)}{\partial t} = D_{s1}(T)\left[\frac{\partial^2 c_{s1}}{\partial r_1^2} + \frac{2}{r_1}\frac{\partial c_{s1}}{\partial r_1}\right]$$

$$\frac{\partial c_{s2}(r_2, t)}{\partial t} = D_{s2}(T)\left[\frac{\partial^2 c_{s2}}{\partial r_2^2} + \frac{2}{r_2}\frac{\partial c_{s2}}{\partial r_2}\right]$$

The first term of the right side of the model expression (M1a) represents an Open Circuit Voltage (OCV) determined by the concentration of the reaction material (lithium) at the active material surface. The second term of the right side represents the overvoltage ($\eta_1\#-\eta_2\#$). The third term of the right side represents the voltage drop when the current passes through secondary battery 1. Thus, the DC pure resistance of the secondary battery 1 is represented by Rd(T) in the expression (M2a).

Figure 7:
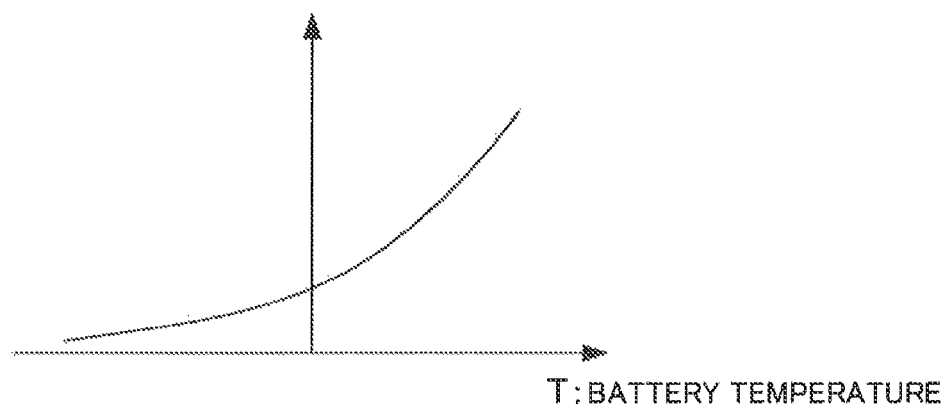
FIG. 7 is a graph for describing temperature dependence of a diffusion coefficient.

In the expression (M2a), diffusion coefficients $D_{s1}$ and $D_{s2}$ used as parameters for specifying the diffusion speed of the lithium corresponding to the reaction material have temperature dependence. Thus, the diffusion coefficients $D_{s1}$ and $D_{s2}$ can be set, for example by using a map shown in FIG. 7. The map shown in FIG. 7 can be previously obtained. In FIG. 7, a battery temperature T on the horizontal axis represents temperatures obtained by using a temperature sensor 203. As shown in FIG. 7, the diffusion coefficients $D_{s1}$ and $D_{s2}$ reduce as the battery temperature drops. In other words, the diffusion coefficients $D_{s1}$ and $D_{s2}$ increase as the battery temperature rises.

For the diffusion coefficients $D_{s1}$ and $D_{s2}$, dependence on the local SOCθ may be considered in addition to the temperature dependence. In this case, preferably, a map representing a relationship between the battery temperature T, the local SOCθ, and the diffusion coefficients $D_{s1}$ and $D_{s2}$ is previously prepared.

Figure 8A:
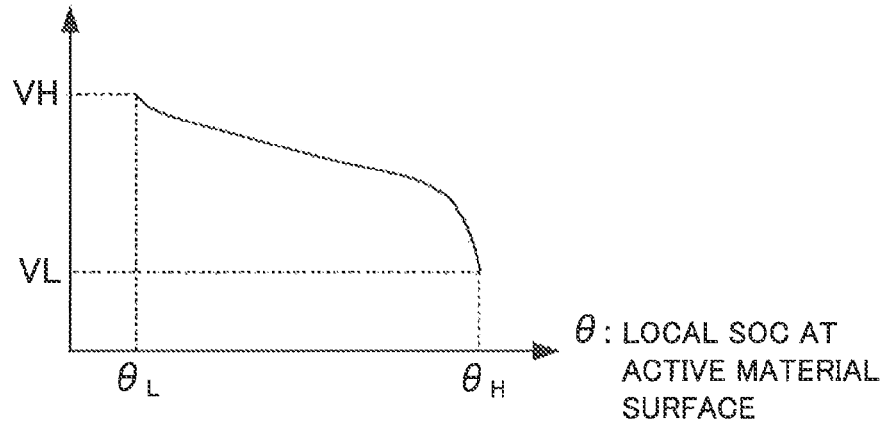
FIG. 8A is a graph showing a relationship between an open circuit voltage (positive electrode) and a local SOC.
Figure 8B:
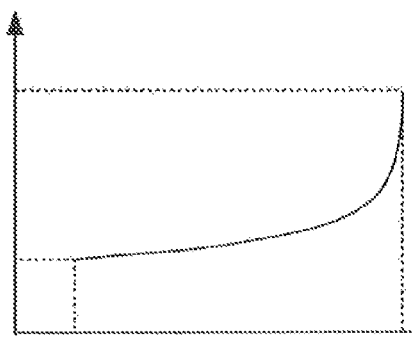
FIG. 8B is a graph showing a relationship between an open circuit voltage (negative electrode) and the local SOC.

As shown in FIG. 8A, the open circuit voltage U1 included in the expression (M1a) reduces as the local SOCθ increases. As shown in FIG. 8B, the open circuit voltage U2 increases as the local SOCθ increases. When the maps shown in FIG. 8A and FIG. 8B are previously prepared, the open circuit voltage U1 and U2 can be specified in association with the local SOCθ.

Exchange current densities $i_{01}$ and $i_{02}$ included in the expression (M1a) have dependence on the local SOCθ and the battery temperature T. Thus, when a map representing a relationship between the exchange current densities $i_{01}$ and $i_{02}$, the local SOCθ, and the battery temperature T is previously prepared, the exchange current densities $i_{01}$ and $i_{02}$ can be specified from the local SOCθ and the battery temperature T.

A DC pure resistance Rd has dependence on temperature. Thus, when a map representing a relationship between the DC pure resistance Rd and the battery temperature T is previously prepared, the DC pure resistance Rd can be specified from the battery temperature T. The abovementioned maps can be formed on the basis of the results of experiments such as well-known AC impedance measurements for the secondary battery 1.

The battery model shown in FIG. 4 can be further simplified. Specifically, a common active material model can be used as the active materials in the electrodes 142 and 141. The active material models 141b and 142b shown in FIG. 4 can be handled as the single active material model to perform the replacement of the expression as shown in the following expression (26). In the following expression (26), the subscript j indicating a distinction between the positive electrode 141 and the negative electrode 142 is omitted.

$$U(\theta, t) = U_1\#(\theta_1, t) - U_2\#(\theta_2, t) \quad (26)$$
$$i_{0j}(\theta_j, T, t) = i_0(\theta, T, t)$$
$$c_{sj}(r_j, t) = c_s(r, t)$$
$$D_{sj} = D_s$$
$$a_{sj} = a_s$$
$$L_j = L$$
$$\alpha_{sj} = \alpha_s$$
$$\theta_j = \theta_1$$

The model expressions (M1a) and (M2a) can be represented by the following expressions (M1b) and (M2b), respectively. For the battery model using the single active material model, a following expression (21') is used instead of the expression (21) as a relationship expression of the current density I(t) and the reaction current density $j_j^{Li}$.

$$V(t) = U(\theta, t) + \frac{RT}{\alpha_a F}\text{arcsinh}\left(\frac{-I(t)}{2La_s i_0(\theta, T, t)}\right) - \quad (M1b)$$

$$I(t)\left(\frac{L_1}{3\kappa_1^{eff}} + \frac{L_s}{3\kappa_s^{eff}} + \frac{L_2}{3\kappa_2^{eff}} + \frac{L_1}{3\sigma_1^{eff}} + \frac{L_2}{3\sigma_2^{eff}}\right)$$

-continued $$Rd(T) = \left(\frac{L_1}{3\kappa_1^{eff}} + \frac{L_s}{3\kappa_s^{eff}} + \frac{L_2}{3\kappa_2^{eff}} + \frac{L_1}{3\sigma_1^{eff}} + \frac{L_2}{3\sigma_2^{eff}}\right) \quad \text{(M2b)}$$

$$\frac{\partial c_s(r,t)}{\partial t} = D_s(T)\left[\frac{\partial^2 c_s}{\partial r^2} + \frac{2}{r}\frac{\partial c_s}{\partial r}\right]$$

$$I(t) = -L \cdot j^{Li} \#(\theta, t) \quad (21')$$

An arcsin h term in the expression (M1a) can be linearly approximated to provide a following expression (M1c). The linear approximation can reduce the computing load and shorten the computing time.

$$V(t) = \{U_1 \#(\theta_1, t) - U_2 \#(\theta_2, t)\} + \quad \text{(M1c)}$$
$$\frac{RT}{\alpha_{a1}F}\frac{-I(t)}{2L_1 a_{s1} i_{01}(\theta_1, T, t)} - \frac{RT}{\alpha_{a1}F}\frac{I(t)}{2L_2 a_{s2} i_{02}(\theta_2, T, t)} -$$
$$I(t)\left(\frac{L_1}{3\kappa_1^{eff}} + \frac{L_s}{3\kappa_s^{eff}} + \frac{L_2}{3\kappa_2^{eff}} + \frac{L_1}{3\sigma_1^{eff}} + \frac{L_2}{3\sigma_2^{eff}}\right)$$

$$Rd(T) = \left(\frac{L_1}{3\kappa_1^{eff}} + \frac{L_s}{3\kappa_s^{eff}} + \frac{L_2}{3\kappa_2^{eff}} + \frac{L_1}{3\sigma_1^{eff}} + \frac{L_2}{3\sigma_2^{eff}}\right) \quad (27)$$

$$Rr(\theta_1, \theta_2, T) = \frac{RT}{2\alpha_{a1}F}\left\{\frac{1}{L_1 \alpha_{s1} i_{01}(\theta_1, T)} + \frac{1}{L_2 \alpha_{s2} i_{02}(\theta_2, T)}\right\}$$

$$V(t) = \{U_1 \#(\theta_1, t) - U_2 \#(\theta_2, t)\} - Rr(\theta_1, \theta_2, T)I(t) - Rd(T) \cdot I(t) \quad (28)$$

In the expression (M1c), a second term of the right side is represented by the product of the current density I(t) and a reaction resistance Rr as a result of the linear approximation. As shown in the expression (27), the reaction resistance Rr is calculated from the exchange current densities $i_{01}$ and $i_{02}$ dependent on the local SOCθ and the battery temperature T. Thus, when the expression (M1c) is used, the map representing a relationship between the local SOCθ, the battery temperature T, and the exchange current densities $i_{01}$ and $i_{02}$ may be previously prepared. According to the expression (M1c) and the expression (27), the expression (28) is obtained.

An arcsin h term corresponding to a second term of the right side in the expression (M1b) can be linearly approximated to provide a following expression (M1d).

$$V(t) = U(\theta, t) + \frac{RT}{\alpha_a F}\frac{-I(t)}{2L_1 a_s i_0(\theta, t)} - \quad \text{(Md1)}$$
$$I(t)\left(\frac{L_1}{3\kappa_1^{eff}} + \frac{L_s}{3\kappa_s^{eff}} + \frac{L_2}{3\kappa_2^{eff}} + \frac{L_1}{3\sigma_1^{eff}} + \frac{L_2}{3\sigma_2^{eff}}\right)$$
$$-Rr(\theta, t) \cdot I(t) = \frac{RT}{\alpha_a F}\frac{-I(t)}{2L_1 a_s i_0(\theta, t)}$$
$$Rd(T) = \left(\frac{L_1}{3\kappa_1^{eff}} + \frac{L_s}{3\kappa_s^{eff}} + \frac{L_2}{3\kappa_2^{eff}} + \frac{L_1}{3\sigma_1^{eff}} + \frac{L_2}{3\sigma_2^{eff}}\right)$$

The expression (M1b) can be represented as a following expression (M1e).

$$V(t) = U(\theta, t) - I(t)Rd(T) + \frac{RT}{\alpha_a F}\text{arcsinh}\left[\frac{-I(t)}{2La_s i_0(\theta, T, t)}\right] \quad \text{(M1e)}$$

The expression (M1e) is represented by a following expression (M1f) through linear approximation.

$$V(t) = U(\theta, t) - I(t)Rd(T) + \frac{RT}{\alpha_a F}\frac{-I(t)}{2La_s i_0(\theta, T, t)} \quad \text{(M1f)}$$

Figure 9:
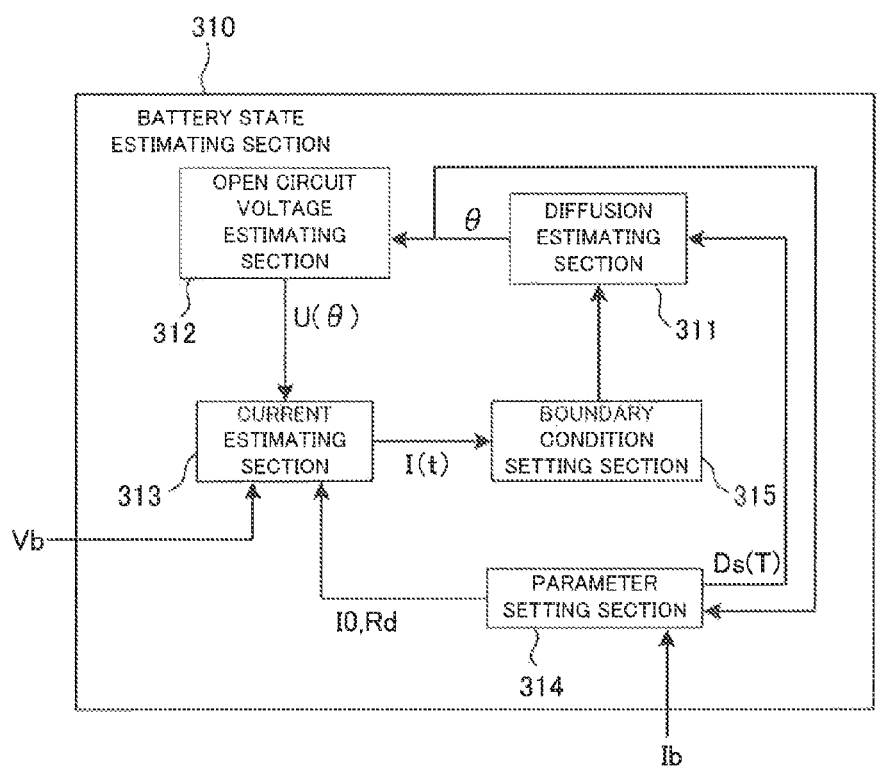
FIG. 9 is a schematic diagram showing a configuration of battery state estimating section provided in a controller.

Next, a configuration for estimating a state of the secondary battery 1 by using the above battery model expressions is explained. FIG. 9 is a schematic diagram showing the internal configuration of the controller 300. A battery state estimating section 310 includes a diffusion estimating section 311, an open circuit voltage estimating section 312, a current estimating section 313, a parameter setting section 314, and a boundary condition setting section 315. In the configuration shown in FIG. 9, the battery state estimating section 310 uses the expression (M1f) and the expression (M2b) to calculate the current, density I(t).

While the current density I(t) is calculated by using the expression (M1f) in the present embodiment, the present, invention is not limited thereto. Specifically, the current density I(t) can be calculated on the basis of an arbitrary combination of any of the expression (M1a) to the expression (M1e) and the expression (M2a) or the expression (M2b).

The diffusion estimating section 311 uses the expression (M2b) to calculate the lithium concentration distribution within the active material based on the boundary condition set in the boundary condition setting section 315. The boundary condition is set on the basis of the expression (5') or the expression (6'). The diffusion estimating section 311 uses the expression (7) to calculate the local SOCθ based on the calculated lithium concentration distribution. The diffusion estimating section 311 outputs information about the local SOCθ to the open circuit voltage estimating section 312.

The open circuit voltage estimating section 312 specifies the open circuit voltage U1 and U2 of the electrodes 142 and 141 based on the local SOCθ calculated, by the diffusion estimating section 311. Specifically, the open circuit voltage estimating section 312 can use the maps shown in FIG. 8A and FIG. 8B to specify the open circuit voltage U1 and U2. The open circuit voltage estimating section 312 can calculate the open circuit voltage of the secondary battery 1 based on the open circuit voltage U1 and U2. The open circuit voltage of the secondary battery 1 is provided by subtracting the open circuit voltage U2 from the open circuit voltage U1.

The parameter setting section 314 sets parameters used in the battery model expression in accordance with the battery temperature Tb and the local SOCθ. The temperature Tb detected by the temperature sensor 203 is used as the battery temperature Tb. The local SOCθ is obtained from the diffusion estimating section 311. The parameters set by the parameter setting section 314 include a diffusion constant $D_s$ in the expression (M2b), and the current density $i_0$ and the DC resistance Rd in the expression (M1f).

The current estimating section 313 uses the following expression (M3a) to calculate (estimate) the current density I(t). The following expression (M3a) is provided by transforming the expression (M1f). In the following expression (M3a), an open circuit voltage U(θ, t) corresponds to an open circuit voltage U(θ) estimated in the open circuit voltage estimating section 312. A voltage V(t) corresponds to the battery voltage Vb obtained by the monitor unit 201. Rd(t) and $i_0(\theta, T, t)$ are values set in the parameter setting section 314, $$I(t) = \frac{U(\theta, t) - V(t)}{Rd(T) + \dfrac{RT}{\alpha_a F 2 L a_s i_0(\theta, T, t)}} \quad \text{(M3a)}$$

When any of the expression (M1a) to the expression (M1e) is used, the current density I(t) can also be calculated in the same manner as that for the expression (M3a) described above.

The boundary condition setting section 315 uses the expression (21) or the expression (21') to calculate the reaction current density (lithium production amount) $j_j^{Li}$ from the current density I(t) calculated by the current estimating section 313. The boundary condition setting section 315 uses the expression (6') to update the boundary condition in the expression (M2b).

Figure 10:
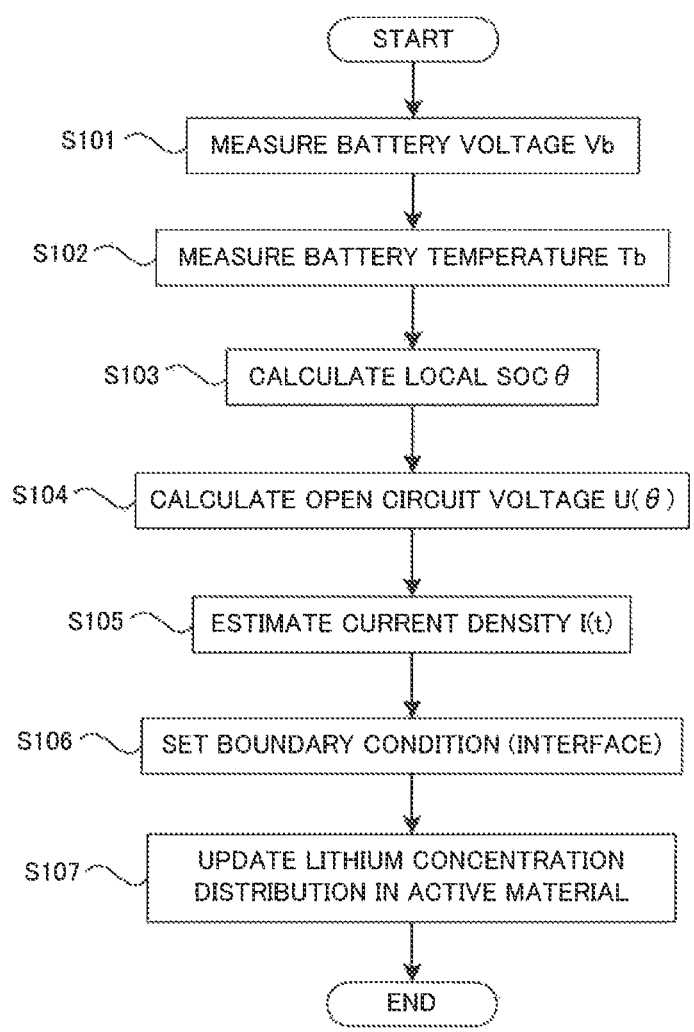
FIG. 10 is a flow chart for describing processing in a battery state estimating section.

Next, the processing of the battery state estimating section 310 is described with reference to a flow chart shown in FIG. 10. The processing shown in FIG. 10 is performed at predetermined intervals.

The battery state estimating section 310 obtains the voltage (battery voltage) Vb of the secondary battery 1 based on the output from the monitor unit 201 at step S101. In addition, the battery state estimating section 310 obtains the temperature (battery temperature) Tb of the secondary battery 1 based on the output from the temperature sensor 203 at step S102.

At step S103, the battery state estimating section 310 (the diffusion, estimating section 311) calculates the local SOCθ based on the lithium concentration distribution in the previous computing with the expression (M2b). At step S104, the battery state estimating section 310 (the open circuit voltage estimating section 312) calculates the open circuit voltage U(θ) from the local SOCθ obtained at step S103.

At step S105, the battery state estimating section 310 (the current estimating section 313) calculates (estimates) a current density Im(t) with the expression (M1f). The estimated current density Im(t) is obtained by substituting the battery voltage Vb, the open circuit voltage U(θ) obtained at step S104, and the parameter values set in the parameter setting section 314 into the expression (M3a).

At step S106, the battery state estimating section 310 (the boundary condition setting section 315) calculates the reaction current density (lithium production amount) $j_j^{Li}$ from the estimated current density I(t) obtained at step 3105. The battery state estimating section 310 (the boundary condition setting section 315) also uses the calculated reaction current, density to set the boundary condition (active material interface) at the active material interface in the expression (M2b).

At step S107, the battery state estimating section 310 (the diffusion estimating section 311) uses the expression (M2b) to calculate the lithium ion concentration distribution within the active material model and updates the estimated value of the lithium ion concentration in each area. The lithium ion concentration (updated value) in the outermost divided, area is used for calculating the local SOCθ at step S103 when the processing shown in FIG. 10 is performed next.

Polarization occurs when the secondary battery 1 is charged or discharged. The OCV (Open Circuit Voltage) of the secondary battery 1 can be obtained after the polarization is eliminated. Since the voltage (CCV, Closed Circuit Voltage) of the secondary battery 1 detected by the monitor unit 201 during the charge or discharge of the secondary battery 1 or immediately after the stop of the charge or discharge of the secondary battery 1 includes a voltage change amount resulting from the polarisation, the OCV of the secondary battery 1 cannot be obtained in that state. When the voltage of the secondary battery 1 with the polarization eliminated, is detected, the detected voltage does not include the voltage change amount resulting from the polarization.

The polarization of the secondary battery 1 includes polarization due to lithium concentration distribution in the active material and polarization due to lithium concentration distribution in the electrolytic solution. As described with reference to FIG. 5, the lithium concentration distribution in the active material is defined by the expressions (5) and (6) or the expressions (5') and (6'). Thus, the lithium concentration distribution in the active material is calculated by the battery state estimating section 310 (the diffusion estimating section 311).

In the battery model described above, the lithium concentration in the electrolytic solution is assumed to be unchanged over time as shown in the expression (3') to assume that $c_{ej}(t)$ has the constant value. The electrolytic solution has an uneven lithium concentration distribution (concentration gradient) in association with the charge and discharge of the secondary battery 1, and a voltage drop occurs due to concentration overvoltage.

When the charge and discharge of the secondary battery 1 are alternately performed, the concentration gradient may be produced by one of the charge and discharge but canceled by the other of the charge and discharge. The cancellation of the concentration gradient results in an extremely low concentration gradient to allow the assumption that the lithium concentration $c_{ej}(t)$ in the electrolytic solution has the constant value as described above. For example, in the vehicle such as the HV and the PHV, the charge and discharge of the secondary battery 1 may be alternately performed, so that the lithium, concentration $c_{ej}(t)$ in the electrolytic solution can be assumed to have the constant value.

When the charge and discharge of the secondary battery 1 are not alternately performed, the concentration gradient is not cancelled but maintained. Specifically, when the secondary battery 1 is continuously charged or continuously discharged, the concentration, gradient easily occurs in the electrolytic solution. For example, the vehicle such as the EV and the PHV may be run by continuously discharging the secondary battery 1. In addition, when the SOC of the secondary battery 1 is reduced, the secondary battery 1 may be supplied with electric power from the external power source to continue the charge of the secondary battery 1. In such a case, the concentration gradient easily occurs in the electrolytic solution.

A lithium concentration distribution $\Delta c_e$ in the electrolytic solution can be estimated by using the following expressions (29) and (30), for example.

$$\Delta c_e(t + \Delta t) = \Delta c_e(t) - \alpha \Delta c_e(t) + \beta I(t) \quad (29)$$

$$\alpha = \frac{2\Delta t D_e^{eff}(T)}{\varepsilon_e \Delta x^2}, \beta = \frac{1 - t_+^0}{F} \frac{\Delta t}{\varepsilon_e \Delta x} \quad (30)$$

The polarization can be eliminated by leaving the secondary battery 1 standing without charge and discharge. Specifically, when the secondary battery 1 is left standing without charge and discharge, the lithium concentration, can be diffused to eliminate the lithium concentration distribution (that is, the polarization), "Leaving the secondary battery 1 standing" means that the secondary battery 1 is left standing without charge and discharge. As the secondary battery 1 is left standing for a longer time, the polarization of the secondary battery 1 is eliminated more easily.

If a fixed value is used for a time used to determine whether or not the polarization of the secondary battery 1 is eliminated, (referred to as a polarization determining time), the following disadvantage is caused.

Since the polarization of the secondary battery 1 changes depending on a history of charge and discharge of the secondary battery 1, the polarization, may be eliminated even when the time for which the secondary battery 1 is left standing is shorter than the polarisation determining time (fixed value), and the polarization may not be eliminated even when the time for which the secondary battery 1 is left standing is longer than the polarization determining time (fixed value). If the polarization determining time is set at a (long) time sufficient for determining that the polarization is eliminated, the elimination of the polarization can be reliably determined. However, the elimination of the polarization cannot be determined until the elapse of the polarisation determining time. Consequently, it takes a longer time than necessary to determine that the polarization is eliminated.

To address this, in the present embodiment, the battery model described above is used to accurately see the present polarization of the secondary battery 1, and the determination of whether or not the polarization of the secondary battery 1 is eliminated is made on the basis of that polarization.

When the voltage of the secondary battery 1 with the polarization eliminated is obtained by using the monitor unit 201, the voltage change amount resulting from the polarization can be ignored, so that the voltage detected by the monitor unit 201 can be regarded as the OCV, and the OCV can be obtained with higher accuracy. The higher accuracy in obtaining the OCV can increase the accuracy in estimating the SOC of the secondary battery 1 accordingly. The SOC refers to the proportion of the present charge capacity to the full charge capacity.

The SOC of the secondary battery 1 is associated with the OCV of the secondary battery 1. Once the association is previously determined, the SOC can be specified (estimated) by obtaining the OCV. If the obtained OCV is deviated from the actual OCV (true value), the estimated SOC based on the association between the OCV and the SOC is deviated from the actual SOC (true value). Thus, the increased accuracy in obtaining the OCV can enhance the accuracy in estimating the SOC.

As described above, the polarization of the secondary battery 1 includes the polarization due to the lithium concentration distribution in the active material and the polarization due to the lithium concentration distribution in the electrolytic solution. In the present embodiment, the battery model described above is used to see the polarization in the active material based on the lithium concentration distribution in the active material and to see the polarization in the electrolytic solution based on the lithium concentration distribution in the electrolytic solution.

Specifically, the time (polarization elimination time) taken to eliminate the polarization in the active material is first specified on the basis of the lithium concentration distribution in the active material, and the time (polarization elimination time) taken to eliminate the polarization in the electrolytic solution is specified on the basis of the lithium concentration distribution in the electrolytic solution. Then, the longer one of the two polarization elimination times is set at the time taken to eliminate the polarization in the whole secondary battery 1. As a result, once it is determined that the time for which the secondary battery 1 is left standing exceeds the longer polarization elimination time, it can be determined that both the polarization in the active material and the polarization in the electrolytic solution are eliminated.

In the present embodiment, the battery model described above can be used to accurately see the present polarization of the secondary battery 1. Specifically, the battery model can be used to find the present lithium concentration distributions in the active material and the electrolytic solution to know the time appropriate for the present lithium concentration distributions as the time taken to eliminate the polarization.

In the present embodiment, the polarisation elimination time for the polarization in the active material and the polarization elimination time for the polarization in the electrolytic solution are considered to determine the time taken to eliminate the polarization in the whole secondary battery 1. If only one of the two polarization elimination times is considered, the polarization may be maintained in one of the active material and the electrolytic solution.

For example, when only the polarization elimination time for the polarization in the active material is considered, and the polarization elimination time for the polarization in the electrolytic solution is longer than the polarization elimination time for the polarization in the active material, the polarization in the electrolytic solution may be maintained. In this case, since the polarization in the electrolytic solution is not eliminated, the voltage obtained by using the monitor unit 201 is deviated from the actual OCV.

In the present embodiment, the longer one of the two polarisation elimination times is set at the time taken to eliminate the polarization in the whole secondary battery 1. This allows the determination of the elimination of both the polarization in the active material and the polarization in the electrolytic solution to prevent the polarization from being maintained in one of the active material and the electrolytic solution. Thus, the voltage obtained by the monitor unit 201 after the determination of the elimination of the polarization is unlikely to be deviated from the actual OCV.

Figure 11A:
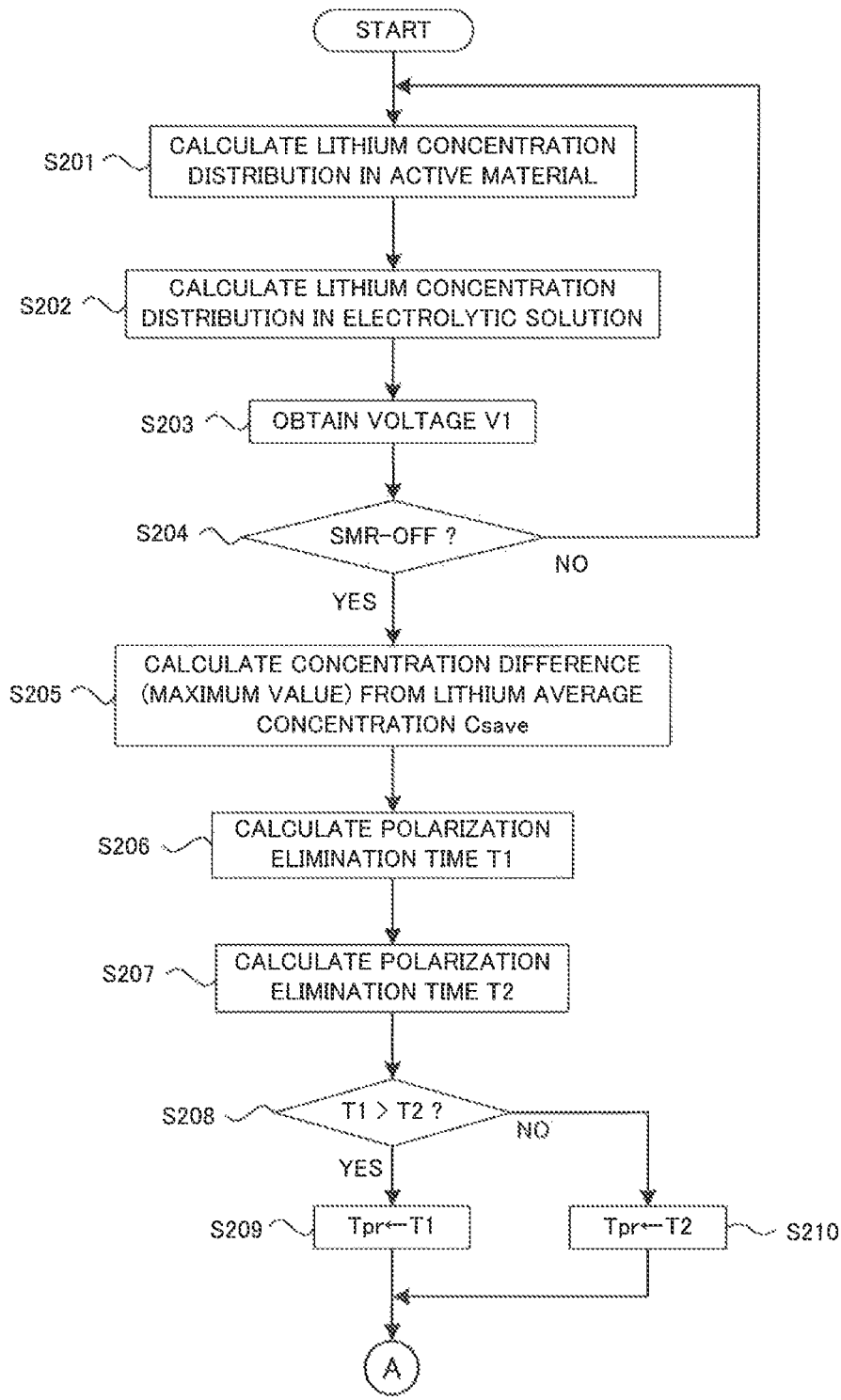
FIG. 11A is a flow chart for describing processing for estimating SOC of the secondary battery.
Figure 11B:
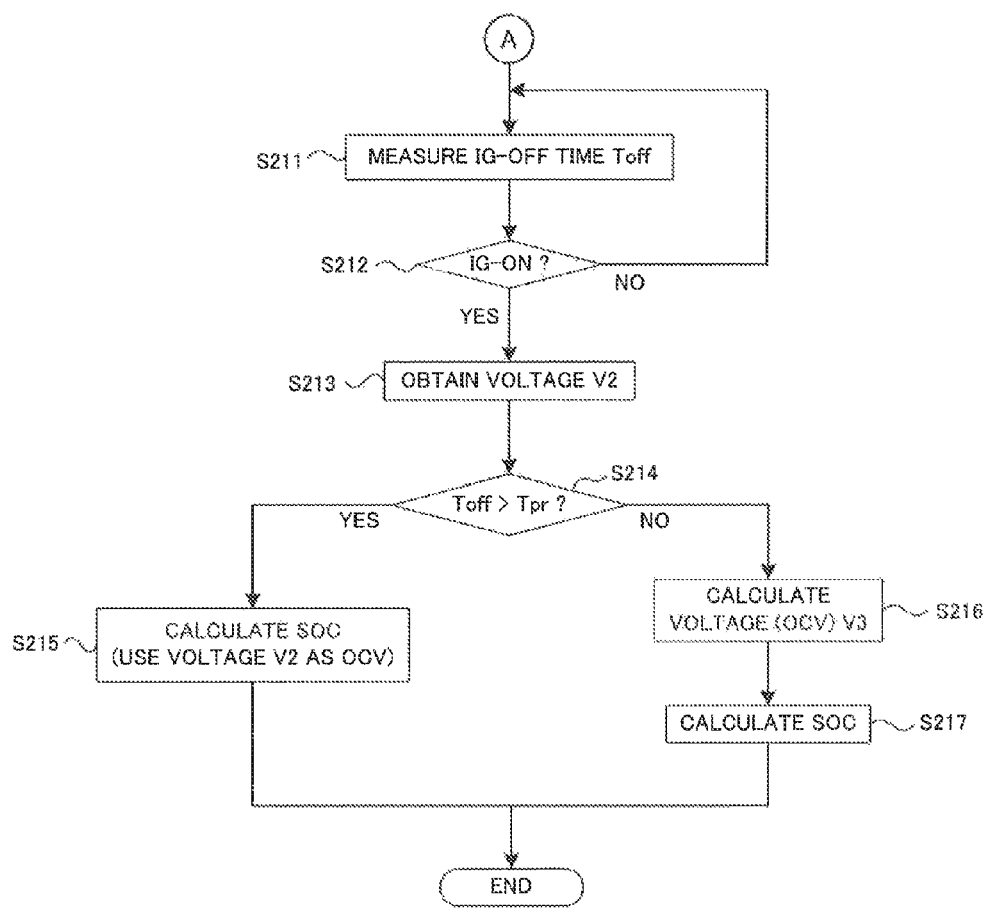
FIG. 11B is a flow chart for describing processing for estimating SOC of the secondary battery.

Next, description is made of processing of estimating the SOC of the secondary battery 1 with reference to flow charts shown in FIG. 11A and FIG. 11B. The processing shown in FIG. 11A and FIG. 11B is performed by the controller 300. At the start of the processing shown in FIG. 11A and FIG. 11B, the system main relays SMR-B and SMR-G are ON, and the battery system shown in FIG. 1 is in a start-up status.

At step S201, the controller 300 calculates the lithium concentration distribution in the active material. Specifically, the controller 300 can calculate the lithium concentration distribution in the active material by performing the processing shown in FIG. 10. At step S202, the controller 300 calculates the lithium concentration distribution in the electrolytic solution by using the expressions (29) and (30).

At step S203, the controller 300 obtains a voltage V1 of the secondary battery 1 based on the output from, the monitor unit 201. In detecting the voltage of the secondary battery 1, in is desirable to pass a current through the secondary battery 1 at a level at which an amount of voltage change caused by the internal resistance of the secondary battery 1 is negligible. The information about the voltage V1 can be stored in the memory 300a.

At step S204, the controller 300 determines whether or not the system main relays SMR-B and SMR-G are switched from ON to OFF. When the ignition switch is switched from ON to OFF, the system main relays SMR-B and SMR-G are switched, from ON to OFF, so that the processing at step S204 means that the controller 300 determines whether or not the ignition switch is switched from ON to OFF.

Until the system main relays SMR-B and SMR-G are switched from ON to OFF, the processing from step S201 to S203 is repeatedly performed. After the system main relays SMR-B and SMR-G are switched from ON to OFF, the controller 300 proceeds to processing at step S205.

At step S205, the controller 300 calculates the lithium average concentration $c_{save}$ based on the lithium concentration distribution calculated in the processing at step S201. Specifically, the controller 300 calculates the lithium average concentration $c_{save}$ by using the following expression (31).

$$c_{save}(t) = \sum_{k=1}^{N} c_{sj,k}(t) \cdot \frac{\Delta V_k}{V} \qquad (31)$$

The lithium concentration $c_{sj,k}(t)$ (k=1 to N) shown in the expression (31) represents the lithium concentration in each area-provided by dividing the active material models 141b and 142b into N in the diameter direction as shown in FIG. 5, and is estimated by the diffusion model expressions (M2a) and (M2b). $\Delta V_k$ represents the volume of each divided area, and V represents the volume of the whole active material. When the active material model common to the positive electrode and the negative electrode is used, the average value of the lithium concentration $c_{s,k}(t)$ (k=1 to N) of each area in the common active material model can be calculated as in the expression (31) to determine the lithium average concentration $c_{save}(t)$.

At step S205, the controller 300 calculates the difference (concentration difference) between the lithium average concentration $c_{save}$ and the lithium concentration $c_{sj,k}$ of each area to specify the maximum concentration difference.

At step S206, the controller 300 calculates a polarization elimination, time (corresponding to a first polarization elimination time) T1 based on the lithium concentration distribution in the active material. The polarization elimination time T1 is the time taken to eliminate the polarization in the active material, that is, the time taken to uniformize the lithium concentration distribution in the active material. The polarization in the active material depends on the lithium concentration distribution in the active material, and the polarization in the active material is eliminated once the lithium concentration distribution is uniformized.

The polarization elimination time T1 can be specified, for example by using a map shown in FIG. 12. The map shown in FIG. 12 represents the relationship between the temperature of the secondary battery 1, the lithium concentration, difference (maximum value) calculated, in the processing at step S205, and the polarization elimination time T1. The map shown in FIG. 12 can be previously determined by an experiment or the like, and the information about the map can be stored in the memory 300a.

With the use of the map shown in FIG. 12, the polarization, elimination time T1 can be specified by obtaining the temperature of the secondary battery 1 and the lithium concentration difference (maximum value). As shown in FIG. 12, as the lithium, concentration difference (maximum, value) increases, the polarization elimination time T1 is extended. In other words, as the lithium concentration difference (maximum value) reduces, the polarization elimination time T1 is shortened. As the temperature of the secondary battery 1 rises, the polarization elimination time T1 is shortened. In other words, as the temperature of the secondary battery 1 drops, the polarization elimination time T1 is extended.

The map shown in FIG. 12 can be formed by leaving the secondary battery 1 standing, measuring the time taken for the lithium concentration difference (maximum value) to fail within an allowable range, and then setting the measured time as the polarization elimination time T1. The allowable range can be appropriately set by taking account of not only the state in which the polarization in one active material is completely eliminated but also the state in which the polarization in the active material can be regarded as being eliminated. In other words, the allowable range can be appropriately set in such a range that the voltage change resulting from the polarization in the active material does not affect the voltage of the secondary battery 1.

Although the polarization elimination time T1 is specified on the basis of the relationship between the temperature of the secondary battery 1, the lithium concentration difference (maximum value), and the polarization elimination time T1, the present invention is not limited thereto. Specifically, the relationship between the lithium concentration difference (maximum, value) and the polarization elimination time T1 can be determined previously and used to specify the polarization elimination time T1 associated with the lithium concentration difference (maximum value).

At step S207, the controller 300 calculates a polarization elimination time (corresponding to a second polarization elimination time) T2 based on the lithium concentration distribution (ace shown in the expression (29)) in the electrolytic solution. The polarization elimination time T2 is the time taken to eliminate the polarization in the electrolytic solution, that is, the time taken to uniformize the lithium concentration distribution in the electrolytic solution. The polarization in the electrolytic solution depends on the lithium concentration distribution in the electrolytic solution, and the polarization in the electrolytic solution is eliminated once the lithium concentration distribution is uniformized.

The polarization elimination time T2 can be specified by using a map shown in FIG. 13. The map shown in FIG. 13 represents the relationship between the temperature of the secondary battery 1, the lithium concentration distribution calculated in the processing at step S202, and the polarization elimination time T2. The map shown in FIG. 13 can be previously determined by an experiment or the like, and the information about the map can be stored in the memory 300a.

With the use of the map shown in FIG. 13, the polarization elimination time T2 can be specified by obtaining the temperature of the secondary battery 1 and the lithium concentration distribution. As shown in FIG. 13, as the lithium concentration distribution is more uneven, the polarization elimination time T2 is extended. In other words, as the lithium concentration distribution is more even, the polarization elimination time T2 is shortened. As the temperature of the secondary battery 1 rises, the polarization elimination time T2 is shortened. In other words, the temperature of the secondary battery 1 drops, the polarization elimination time T2 is extended.

The map shown in FIG. 13 can be formed by leaving the secondary battery 1 standing, measuring the time taken, for the lithium concentration distribution to fall within an allowable range, and then setting the measured time as the polarization elimination time T2. The allowable range can be appropriately set by taking account of not only the state in which the polarization in the electrolytic solution is completely eliminated but also the state in which the polarization in the electrolytic solution can be regarded as being eliminated. In other words, the allowable range can be appropriately set in such a range that the voltage change resulting from the polarization in the electrolytic solution does not affect the voltage of the secondary battery 1.

Although the polarization elimination time T2 is specified on the basis of the relationship between the temperature of the secondary battery 1, the lithium, concentration distribution, and the polarization elimination time T2, the present invention is not limited thereto. Specifically, the relationship between the lithium concentration distribution and the polarization elimination time T2 can be determined previously and used to specify the polarization elimination time T2 associated with the lithium concentration distribution.

At step S208, the controller 300 compares the polarization elimination time T1 calculated in the processing at step S206 with the polarization elimination time T2 calculated in the processing at step S207. When the polarization elimination time T1 is longer than the polarization elimination time T2, the controller 300 proceeds to processing at step S209. When the polarization elimination time T1 is shorter than the polarization elimination time T2, the controller 300 proceeds to processing at step S210.

At step S209, the controller 300 sets the polarization, elimination time T1 as a time (polarization elimination time) $T_{pr}$ for determining that the polarization of the secondary battery 1 is eliminated. At step S210, the controller 300 sets the polarization elimination time T2 as the polarization, elimination time $T_{pr}$. In the processing at steps S209 and S210, the longer one of the polarization elimination times T1 and T2 is set as the polarization elimination time $T_{pr}$.

This setting of the polarization elimination time $T_{pr}$ allows the determination that both the polarization in the active material and the polarization in the electrolytic solution are eliminated when the time for which the secondary battery 1 is left standing is longer than the polarization elimination time $T_{pr}$. If the shorter one of the polarization elimination times T1 and T2 is set as the polarization elimination time $T_{pr}$, one of the polarizations in the active material and the electrolytic solution, may not be eliminated even when the time for which the secondary battery 1 is left standing is longer than the polarization elimination time $T_{pr}$.

The setting of the longer one of the polarization elimination times T1 and T2 as the polarization elimination time $T_{pr}$ in the present embodiment allows the determination of whether or not both the polarizations in the active material and the electrolytic solution, are eliminated.

At step S211, the controller 300 uses the timer 300b to measure a time $T_{off}$ for which the ignition switch is OFF. The time $T_{off}$ corresponds to the time (duration) for which the secondary battery 1 is left standing.

At step S212, the controller 300 determines whether or not the ignition switch is switched from OFF to ON. When, the ignition switch remains OFF, the controller 300 returns to the processing at step S211 and continues to measure the time $T_{off}$. When the ignition switch is switched from OFF to ON, the controller 300 proceeds to processing at step S213. When the ignition switch is switched from OFF to ON, the measurement of the time $T_{off}$ is ended, and the information about the time $T_{off}$ is stored in the memory 300a.

At step 3213, the controller 300 obtains a voltage V2 of the secondary battery 1 based on the output from, the monitor unit 201. In detecting the voltage of the secondary battery 1, it is desirable to pass a current through the secondary battery 1 at a level at which an amount of voltage change caused by the internal resistance of the secondary battery 1 is negligible. The information about the voltage V2 can be stored in the memory 300a.

At step S214, the controller 300 determines whether or not the time $T_{off}$ obtained in the processing at step S211 is longer than the polarization elimination time $T_{pr}$ set in the processing at step S209 or step S210. When the time $T_{off}$ is longer than the polarization elimination time $T_{off}$, the controller 300 determines that, the polarization of the secondary battery 1, that is, the polarization in the active material, and the polarization in the electrolytic solution, are eliminated, and proceeds to processing at step S215. When the time $T_{off}$ is shorter than the polarization elimination time $T_{pr}$, the controller 300 determines that the polarization of the secondary battery 1 is not eliminated, and proceeds to processing at step S216.

At step S215, the controller 300 calculates the SOC of the secondary battery 1 based on the voltage V2 obtained in the processing at step S213. When the controller 300 proceeds from the processing at seep S214 to the processing at step S215, the polarization of the secondary battery 1 is eliminated, and the voltage V2 can be regarded as the OCV of the secondary battery 1. Thus, a map representing the relationship between the SOC and the OCV can be used to specify the SOC associated with the voltage (OCV) V2.

Figure 14:
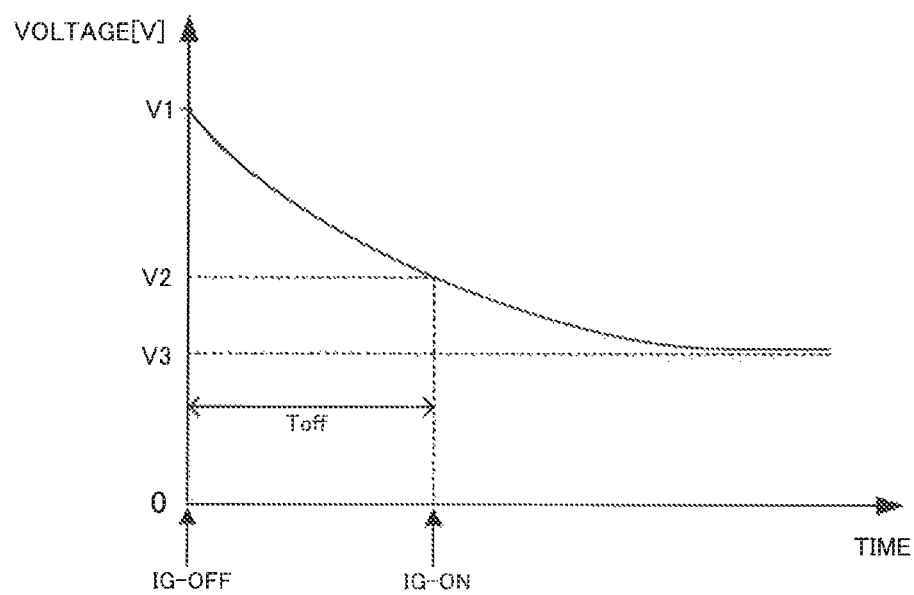
FIG. 14 is a graph showing a voltage change when the polarization is eliminated.

At step S216, the controller 300 uses the voltage V1 obtained in the processing at step S203 and the voltage V2 obtained in the processing at step S213 to calculate a voltage V3 serving as the OCV of the secondary battery 1. FIG. 14 shows a voltage change in the secondary battery 1 (voltage drop characteristic) when the secondary battery 1 is left standing. As shown in FIG. 14, as the secondary battery 1 is left standing for a longer time, that is, as the elimination of the polarization of the secondary battery 1 proceeds, the voltage of the secondary battery 1 is reduced by the amount corresponding to the polarization. In other words, as the elimination of the polarization of the secondary battery 1 proceeds, the voltage of the secondary battery 1 approaches the voltage V3 serving as the OCV.

As shown in FIG. 14, immediately be fore the ignition switch is switched from ON to OFF, the voltage of the secondary battery 1 is at V1. As the secondary battery 1 is left standing for a longer time, the voltage of the secondary battery 1 is reduced. When the ignition switch is switched from OFF to ON before the time $T_{off}$ exceeds the polarization elimination time $T_{pr}$, the voltage V2 obtained at this point is higher than the voltage V3 serving as the OCV. Since the polarization of the secondary battery 1 remains at the time when the voltage V2 is obtained, the voltage V2 is higher than, the voltage V3 serving as the OCV by the voltage change amount corresponding to the polarization.

The voltage change shown in FIG. 14 can be previously determined by an experiment or the like and can be represented as an expression. Depending on the characteristics of the secondary battery 1, the voltage change shown in FIG. 14 can be represented by the following expression (32), for example.

$$V = (V1 - V3)\exp\left(-\frac{T_{off}}{\tau}\right) + V3 \quad (32)$$

In the expression (32), V1 represents the voltage obtained in the processing at step S203, and V3 represents the OCV of the secondary battery 1. $T_{off}$ represents the time obtained in the processing at step S211, and τ represents the time constant for the polarization elimination time $T_{pr}$. By previously determining the relationship between the polarization elimination time $T_{pr}$ and the time constant $\tau$, the relationship can be used to specify the time constant tτ for the polarization elimination time $T_{pr}$. The expression (32) can be transformed into the following expression (33).

$$V3 = V1 - \frac{(V1 - V2)}{\exp\left(-\frac{T_{off}}{\tau}\right)} \qquad (33)$$

According to the expression (33), the OCV of the secondary battery 1 can be calculated. Specifically, the voltages V1 and V2, the time constant $\tau$, and the time $T_{off}$ can be substituted into the expression (33) to calculate the voltage V3 serving as the OCV.

At step S217, the controller 300 estimates the SOC of the secondary battery 1 based on the voltage (OCV) V3 calculated in the processing at step S216. Specifically, the map representing the relationship between the OCV and the SOC can be used to specify the SOC associated with the voltage V3.

Since the polarization elimination time associated with the present lithium concentration distribution can be obtained in the present embodiment, the polarization elimination time can be estimated appropriately. The battery model expression can be used to estimate the lithium concentration distribution, so that the estimated lithium concentration distribution can factor in the use state, the deterioration state, and the use environment (particularly, the temperature) of the secondary battery 1. As a result, the polarization elimination time can be estimated, in view of the use state, the deterioration state, and the use environment of the secondary battery 1. It is not necessary to leave the secondary battery 1 standing for a longer time than necessary in the determination of the polarization elimination state. This can increase the chance that the elimination of the polarization can be determined.

Since both the lithium concentration, distribution in the active material and the lithium concentration distribution in the electrolytic solution are considered in the present embodiment, it can be determined whether or not the polarization is eliminated in the whole secondary battery 1. This can prevent one of the polarization in the active material and the polarization in the electrolytic solution from being maintained.

According to the present embodiment, the accuracy in estimating the SOC of the secondary battery 1 can be increased, so that the accuracy in estimating the full charge capacity calculated from the SOC of the secondary battery 1 can be increased. The full charge capacity CAP of the secondary battery 1 can be calculated by using the following expression (34).

$$CAP = \frac{\sum I \times 100}{SOC\_e - SOC\_s} \qquad (34)$$

In the expression (34), $\Sigma I$ represents the value of sum of currents found while the secondary battery 1 is charged or discharged, and is calculated by summing the current values detected by the current sensor 202 during the charge or discharge. SOC_s represents the SOC of the secondary battery 1 at the start of the charge or discharge, and SOC_e represents the SOC of the secondary battery 1 at the end of the charge or discharge. The current sum value $\Sigma I$ corresponds to the value of sum of currents detected while the SOC of the secondary battery 1 changes from the SOC_s to the SOC_e.

Since the accuracy in estimating the SOC_s and the SOC_e can be increased according to the present embodiment, the accuracy in estimating the full charge capacity CAP can be increased. Once the full charge capacity of the secondary battery 1 is estimated, the deterioration state of the secondary battery 1 can be seen. Since the full charge capacity of the secondary battery 1 is reduced as the deterioration of the secondary battery 1 proceeds, the deterioration state of the secondary battery 1 can be determined in accordance with the reduction in full charge capacity.

The plurality of secondary batteries 1 constituting the assembled battery 100 may vary in deterioration and temperature. In this case, the plurality of secondary batteries 1 may vary in polarization elimination time $T_{pr}$. For determining that the polarization is eliminated in the whole assembled battery 100, the determination can be made by using one of the secondary batteries 1 with the longest polarization elimination time $T_{pr}$ as a reference. Specifically, the polarization elimination time $T_{pr}$ is calculated for each secondary battery 1, and the longest of the polarization elimination times $T_{pr}$ can be used to determine whether or not the polarization is eliminated in the whole assembled battery 100.

In the configuration described above in which, the voltage of the battery block is detected instead of the voltage of the secondary battery 1, the polarization elimination time $T_{pr}$ of the battery block can be estimated and the SOC of the battery block can be estimated in the same manner as that in the present embodiment. For determining whether or not the polarization is eliminated in the whole assembled battery 100, the longest of the polarization elimination times $T_{pr}$ for the plurality of battery blocks may be used as a reference.

When the OCV of the secondary battery 1 is obtained after the elimination of the polarization of the secondary battery 1 is ensured, the plurality of secondary batteries 1 constituting the assembled battery 100 can be checked for variations in OCV. If the variations in OCV are present, equalization can be performed to reduce the variations in OCV.

For the equalization, an equalizing circuit is connected electrically in parallel to each secondary battery 1, and a particular one of the equalizing circuits can be operated to discharge only the secondary battery 1 associated with that equalizing circuit. Since the discharge of the secondary battery 1 can reduce the OCV of the secondary battery 1, the secondary battery 1 having a higher OCV can be discharged to reduce the variations in OCV between the plurality of secondary batteries 1.

The invention claimed is:

1. A battery system comprising:
a chargeable and dischargeable battery unit; and
a controller estimating a polarization state of the battery unit,
wherein the controller is configured to:
calculate a concentration distribution in an active material of the battery unit by using a diffusion equation, and calculate a first polarization elimination time taken for the concentration distribution in the active material to fall within an allowable range assuming that the charge and the discharge of the battery unit is not performed,
calculate a concentration distribution in an electrolyte of the battery unit by using a diffusion equation, and calculate a second polarization elimination time taken for the concentration distribution in the electrolyte to fall within an allowable range assuming that the charge and the discharge of the battery unit is not performed, measure a time for which the charge and the discharge of the battery unit is not performed try using a timer, and determine that polarization of the battery unit is eliminated when the time for which the charge and the discharge of the battery unit is not performed is longer than a longer polarization elimination time of the first polarization elimination time and the second polarization elimination time.

2. The battery system according to claim 1, wherein the controller is configured to:

obtain a voltage of the battery unit by using a voltage sensor when the time for which the charge and the discharge of the battery unit is not performed is longer than the longer polarization elimination time, and use information representing a relationship between charge states and open circuit voltages of the battery unit to specify the charge state associated with the obtained voltage.

3. The battery system according to claim 1, wherein the controller is configured to use a voltage drop characteristic of the battery unit observed while the charge and the discharge of the battery unit is not performed to calculate an open circuit voltage of the battery unit when the time for which the charge and the discharge of the battery unit is not performed is shorter than the longer polarization elimination time.

4. The battery system according to claim 1, wherein the controller is configured to:

calculate a maximum concentration at which a largest difference is present between an average concentration calculated from the concentration distribution in the active material and a concentration in the active material, and use a relationship between the maximum concentration and the first polarization elimination time to specify the first polarization elimination time associated with the calculated maximum concentration.

5. The battery system according to claim 1, wherein the controller is configured to use a relationship between the concentration distribution in the electrolyte and the second polarization elimination time to specify the second polarization elimination time associated with the calculated concentration distribution in the electrolyte.

6. The battery system according to claim 1, wherein the controller is configured to set a concentration at each of the center and an interface of the active material as a boundary condition and to use the diffusion equation to calculate the concentration distribution in the active material.

7. The battery system according to claim 1, wherein the battery unit is a unit cell.

8. The battery system according to claim 1, wherein the battery unit has a plurality of unit cells connected electrically.

9. The battery system according to claim 1, wherein the battery unit is configured to output an electric energy which is to be converted into a kinetic energy for running a vehicle.

10. A determination method for determining a polarization state of a chargeable and dischargeable battery unit, comprising:

calculating a concentration distribution in an active material of the battery unit by using a diffusion equation, and calculating a first polarization elimination time taken for the concentration distribution in the active material to fall within an allowable range assuming that the charge and the discharge of the battery unit is not performed, calculating a concentration distribution in an electrolyte of the battery unit by using a diffusion equation, and calculating a second polarization elimination time taken for the concentration distribution in the electrolyte to fall within an allowable range assuming that the charge and the discharge of the battery unit is not performed, measuring a time for which the charge and the discharge of the battery unit is not performed by using a timer, and determining that polarization of the battery unit is eliminated when the time for which the charge and the discharge of the battery unit is not performed is longer than a longer polarization elimination time of the first polarization elimination time and the second polarization elimination time.

* * * * *